United States Patent
Brock

(10) Patent No.: US 9,647,149 B2
(45) Date of Patent: May 9, 2017

(54) METHOD AND SYSTEM FOR RAPID AND CONTROLLED ELEVATION OF A RAISABLE FLOOR FOR POOLS

(71) Applicant: Dovi Brock, Tel-Aviv (IL)

(72) Inventor: Dovi Brock, Tel-Aviv (IL)

(*) Notice: Subject to any disclaimer, the term of this patent is extended or adjusted under 35 U.S.C. 154(b) by 0 days.

(21) Appl. No.: 14/590,018

(22) Filed: Jan. 6, 2015

(65) Prior Publication Data
US 2015/0107014 A1    Apr. 23, 2015

Related U.S. Application Data

(60) Division of application No. 13/105,697, filed on May 11, 2011, now Pat. No. 8,925,121, which is a continuation-in-part of application No. PCT/IL2009/001081, filed on Nov. 17, 2009.

(60) Provisional application No. 61/115,222, filed on Nov. 17, 2008.

(51) Int. Cl.
*E04H 4/00* (2006.01)
*H01L 31/0224* (2006.01)
*H01L 31/068* (2012.01)
*H01L 31/18* (2006.01)

(52) U.S. Cl.
CPC ......... *H01L 31/022433* (2013.01); *E04H 4/00* (2013.01); *H01L 31/068* (2013.01); *H01L 31/1804* (2013.01); *Y02E 10/547* (2013.01); *Y02P 70/521* (2015.11); *Y10T 29/49002* (2015.01); *Y10T 29/49826* (2015.01)

(58) Field of Classification Search
CPC .................................................... E04H 4/065
USPC ..................................................... 4/488–513
See application file for complete search history.

(56) References Cited

U.S. PATENT DOCUMENTS

| | | | | |
|---|---|---|---|---|
| 2,060,753 A | * | 11/1936 | Cochin | B66F 7/18 254/93 L |
| 2,581,886 A | * | 1/1952 | Rockwell | F01M 1/16 184/6.23 |
| 3,332,248 A | * | 7/1967 | Burnett | B63B 9/00 114/44 |
| 3,413,661 A | * | 12/1968 | Ross | E04H 4/065 4/501 |
| 3,423,768 A | * | 1/1969 | Glenn | E04H 4/065 4/501 |
| 3,670,343 A | * | 6/1972 | Gansloser | E04H 4/065 4/495 |
| 3,955,797 A | * | 5/1976 | Richards | E04H 4/065 254/89 H |
| 4,008,497 A | * | 2/1977 | Badon | E04H 4/065 4/487 |
| 4,229,843 A | * | 10/1980 | Belanger | E04H 4/065 4/495 |
| 4,271,542 A | * | 6/1981 | Wood | E04H 4/14 4/494 |
| 4,747,168 A | * | 5/1988 | Sing | A62B 99/00 4/504 |

(Continued)

FOREIGN PATENT DOCUMENTS

FR    2 581 886    11/1986

OTHER PUBLICATIONS

Supplementary European Search Report of Application No. EP 09 82 5847 mailed on Nov. 2, 2015.

*Primary Examiner* — Lori Baker
(74) *Attorney, Agent, or Firm* — Pearl Cohen Zedek Latzer Baratz LLP

(57) ABSTRACT

A method for assembling a rapid elevation floor system in a pool, the method comprising the stages of: assembling a raisable floor inside said pool and adding sensors to said raisable floor, and connecting said raisable floor platform to auxiliary units. The method further comprises laying flooring tiles on said raisable floor and sinking said raisable floor to a bottom of said pool.

5 Claims, 11 Drawing Sheets

(56) References Cited

U.S. PATENT DOCUMENTS

| | | | | |
|---|---|---|---|---|
| 4,937,896 A * | 7/1990 | Niimura | E04H 4/065 | 4/495 |
| 5,025,512 A * | 6/1991 | Niimura | E04H 4/065 | 187/360 |
| 5,678,253 A * | 10/1997 | Baker | E04H 4/065 | 254/89 R |
| 5,832,547 A * | 11/1998 | Burroughs | E04H 4/065 | 4/495 |
| 6,105,180 A * | 8/2000 | Kramer | E04H 4/065 | 254/92 |
| 6,127,930 A * | 10/2000 | Steffanus | E04H 4/065 | 340/539.1 |
| 6,253,390 B1 * | 7/2001 | Laks | E04H 4/065 | 4/488 |
| 6,389,615 B2 | 5/2002 | Perrier | | |
| 6,493,885 B2 * | 12/2002 | Perrier | E04H 4/065 | 4/504 |
| 6,640,504 B2 * | 11/2003 | Pearlson | E04H 4/065 | 4/495 |
| 7,625,097 B2 * | 12/2009 | Endo | B66B 11/0233 | 313/485 |
| 8,418,814 B1 * | 4/2013 | Byers | B66D 1/54 | 182/144 |
| 8,485,952 B2 * | 7/2013 | Gehrke | A47C 20/021 | 482/130 |
| 8,695,308 B2 * | 4/2014 | Falk | E04B 2/96 | 52/745.21 |
| 8,978,570 B2 * | 3/2015 | Mauck | B63B 35/44 | 114/266 |
| 2007/0090722 A1 * | 4/2007 | Mou | B81B 3/0062 | 310/309 |
| 2009/0301523 A1 * | 12/2009 | Barnhill | G08B 21/245 | 134/18 |
| 2012/0184968 A1 * | 7/2012 | Schena | A61B 19/22 | 606/130 |
| 2013/0144116 A1 * | 6/2013 | Cooper | A61B 1/00087 | 600/102 |
| 2013/0152300 A1 * | 6/2013 | Mizuno | A45D 19/10 | 4/519 |
| 2013/0160198 A1 * | 6/2013 | Mizuno | A45D 19/08 | 4/517 |

* cited by examiner

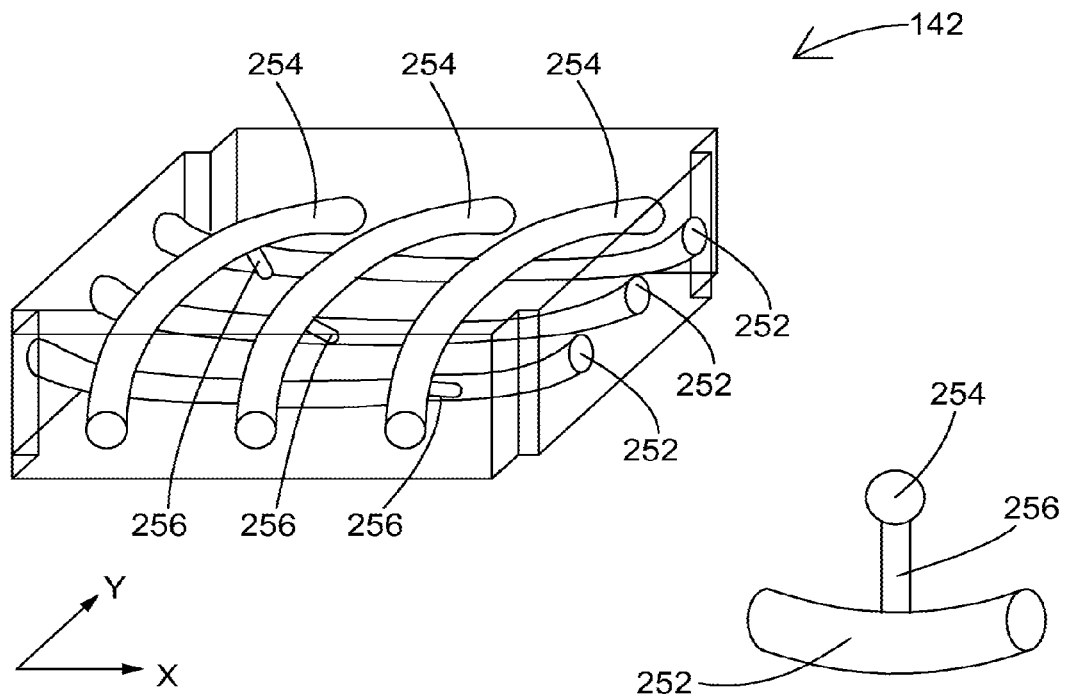
Fig. 8a
Fig. 8b
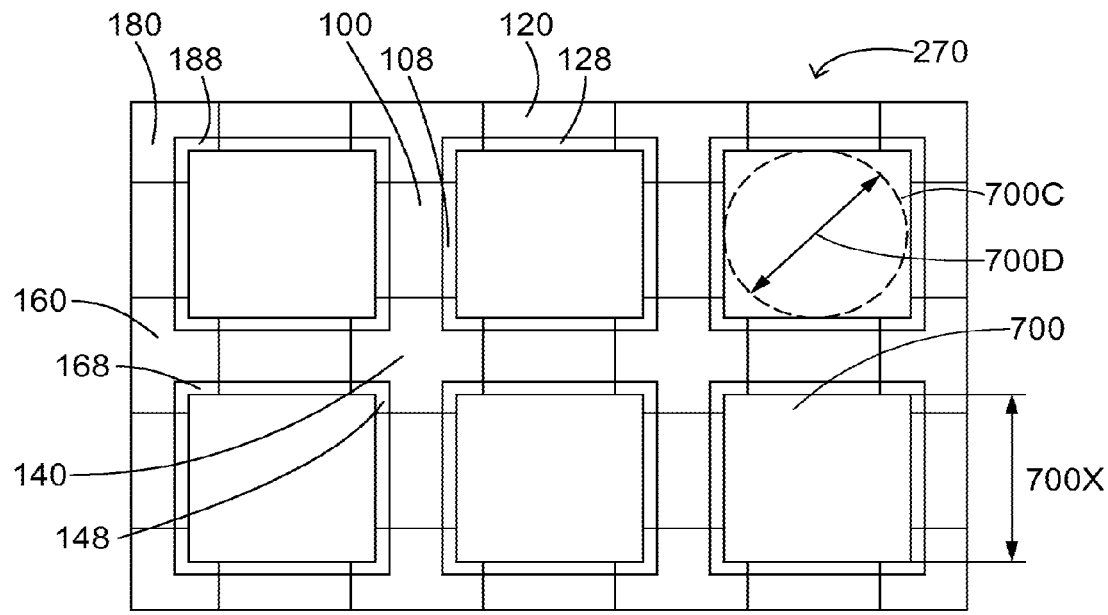
Fig. 9a

METHOD AND SYSTEM FOR RAPID AND CONTROLLED ELEVATION OF A RAISABLE FLOOR FOR POOLS

CROSS-REFERENCE TO RELATED APPLICATIONS

This application is a divisional application of U.S. application Ser. No. 13/105,697 filed May 11, 2011, which is a continuation-in-part application of International Application No. PCT/IL2009/001081, filed on Nov. 17, 2009, which claims priority of U.S. Provisional Patent Application No. 61/115,222, filed on Nov. 17, 2008, both of which are incorporated in their entirety herein by reference.

FIELD OF THE INVENTION

The present invention relates to a raisable floor for pools and more particularly, to a method and a system for rapid and controlled elevation of a raisable floor for pools.

BACKGROUND OF THE INVENTION

Raisable pool floors for aquatic pools are known in the art. In standard practice, the buoyancy of the raisable pool floors is adjusted by pumping air into a ballasting receptacle, to change the pool floor depth.

U.S. Pat. No. 6,253,390 of Laks, entitled "Aquatic Raisable Floor Apparatus", which is incorporated by reference for all purposes as if fully set forth herein, is directed to a pool floor system, which enables raising the pool floor, by compressing air into buoyancy chambers. The pool floor system includes a pool floor platform, several buoyancy chambers, an air compressor, a plurality of exhaust valves, a control panel and a guiding mechanism.

Each buoyancy chamber is connected to the lower side of the platform underneath thereof, with the air compressor, and with a pair of exhaust valves. The control panel is connected to a compressed gas source and with the exhaust valves. A control system regulates the compressed air flow and exhaust valve operation. The platform is similar in size to the floor of the pool. The weight of the platform is such that, when the buoyancy chambers are filled with air, the platform rises toward the water surface. When it is desired to have the platform move towards the bottom of the pool, the control panel opens the exhaust valves, allowing air from the buoyancy chambers to vent out into the atmosphere. The venting of air causes water from the pool to move and occupy, the buoyancy chambers, thereby reducing the buoyancy of the chambers, and lowering the platform to the bottom of the pool.

The guiding mechanism is in the form of a plurality of vertical racks attached to side walls of the pool. The guiding mechanism guides the platform up and down, and keeps the platform in a horizontally leveled position. The guiding mechanism further includes a locking mechanism for locking the platform at a desired height.

U.S. Pat. No. 6,389,615 to Perrier, entitled "Fail-Safe Safety Swimming Pool Net", which is incorporated by reference for all purposes as if fully set forth herein, is directed to a buoyant safety bottom, submerged at the bottom of a pool, and ready to float in case a person drowns in the pool. The safety bottom system includes the buoyant safety bottom, a plurality of hydraulic submerging mechanisms, and a detection system. The buoyant safety bottom is made of a rigid non-buoyant material perforated with circular drains. The buoyant safety bottom is encircled with peripheral floats. Each drain of the buoyant safety bottom is encircled by a flotation ring. The entire buoyant safety bottom, including the peripheral floats and the floating rings, is buoyant. The submerging mechanisms are connected with the buoyant safety bottom and with the detection system. The submerging mechanisms include a retaining part.

The submerging mechanisms submerge the buoyant safety bottom and keep it at the bottom of the pool. When the detection system detects a drowning person, it sends a control signal to the submerging mechanisms, for releasing the buoyant safety bottom. The buoyant safety bottom floats to the surface of the water, and rescues the drowning person.

U.S. Pat. No. 4,229,843 to Belanger, entitled "Pool Floor", is directed to an adjustable flooring structure for swimming pools. The adjustable flooring structure includes a plurality of modules, a plurality of grill areas and a pump. Each of the modules includes two composite rectangular panels and ballasting polyvinylchloride (PVC) pipes interconnected between the panels. The ballasting pipes of each of the modules interconnect with the ballasting pipes of adjacent modules, to form a continuum of ballasting pipes. The ballasting pipes of one of the corner modules are connected with the pump. A first portion of the grill areas encircle the flooring structure, and a second portion of the grill areas is interconnected between rows of the modules.

The modules are characterized by a low level of negative buoyancy. In this manner, even a small volume ballasting means and a small pump capacity causes the entire module to float or submerge. The grill areas facilitate water circulation when the adjustable flooring structure moves up and down. After installation of the adjustable flooring structure, the adjustable flooring structure floats on top of the water surface. For submerging the floor, one turns on the pump. The pump commences to fill the ballasting pipes with water, to submerge the adjustable flooring structure to the bottom of the pool. If one wishes to adjust the height of the adjustable flooring structure, a plurality of leg assemblies may be connected to each module.

In order to effectively serve for rescuing drowning people and even animals by means of raisable pool floors, the elevation must be automatic, highly reliable, and sufficiently fast to enable the victim to receive effective CPR before too much time elapses to be saved.

None of the prior art devices comprises all of the above characteristics and functions.

There is therefore a need for a method and a system for rapid and controlled elevation of a raisable floor for pools, which comprises a combination of all of the above characteristics and functions.

SUMMARY OF THE INVENTION

The background art does not teach or suggest a system for rescue of a drowning victim from the water which works automatically, at sufficient speed and reliability.

According to the disclosed technique there is provided a novel system and method for rapidly elevating a sunken platform from the pool bottom pool floor, which overcomes the disadvantages of the prior art.

In accordance with the disclosed technique, there is thus provided a system for rapidly elevating a floor platform from the bottom of a pool, the pool being at least partially filled with pool water. The system includes a raisable floor with upper surface for disposing over the bottom of the pool. The raisable floor is combined of a plurality of modular floor elements, at least some of which include a ballasting receptacle. The ballasting receptacle is adapted to receive and discharge a volume of a flotation gas or fluid with a sufficiently low specific weight relative to that of the pool water, enabling the pool water to occupy any part of the volume when unoccupied by the flotation fluid. A flotation fluid conducting tubing in fluid connection with the ballasting receptacle(s), conducts the flotation fluid into at least one ballasting receptacle from a floatation fluid source, such a compressor. When the raisable floor system is disposed beneath the surface of the pool water, the amount of the flotation fluid contained in the raisable floor system is adjusted to render the specific weight of the raisable floor system as equal to, or as slightly greater than the specific weight of the pool water, such that pumping of the flotation fluid into the ballasting receptacle(s) urges a rapid elevation of the raisable floor.

In accordance with another aspect of the disclosed technique, there is thus provided a method and a system for rapidly elevating a sunken elevating floor platform from the pool bottom, the pool being at least partially filled with pool water. The system includes a raisable floor for disposing over the bottom of the pool. The raisable floor is combined of a plurality of modular floor elements at least some of which include a ballasting receptacle. The ballasting receptacle is adapted to receive and discharge a volume of a flotation fluid or gas with a specific weight sufficiently lower than that of the pool water, enabling the pool water to occupy any part of the volume when unoccupied by the flotation fluid. A plurality of floor tiles is coupled with the modular floor elements in order to form a continuous floor, matching the bottom of the pool. A flotation fluid conducting tubing in fluid connection with the ballasting receptacle(s), conducts the flotation fluid into at least one ballasting receptacle from a flotation fluid pumping unit. When the raisable floor system is disposed beneath the surface of the pool water, the amount of the flotation fluid contained in the raisable floor system is adjusted to render the specific weight of the raisable floor system as equal to, or as slightly greater than the specific weight of the pool water, such that pumping of the flotation fluid into the ballasting receptacle(s) urges a rapid elevation of the raisable floor.

Additional objects and advantages of the invention will be set forth in part in the description which follows and, in part, will be obvious from the description, or may be learned by practice of the invention.

According to the present invention there is provided a modular rapid elevation floor system, for disposing over the bottom of a pool, the rapid elevation floor system including: (A) a raisable floor.

According to another feature of the present invention the raisable floor includes: (a) inner elongated modular floor elements; (b) at least two peripheral elongated modular floor elements, having peripheral elongated modular floor element ballasting receptacle portion outer facets; (c) at least one cross intersection modular floor elements; (d) at least two T-intersection modular floor elements; and (e) at least two corner modular floor elements, wherein each of the corner modular floor elements is operatively connected to two of the peripheral elongated modular floor elements, wherein each of the T-intersection modular floor elements is operatively connected to two peripheral elongated modular floor elements, wherein each of the inner elongated modular floor elements is operatively connected to one of the T-intersection modular floor elements, and to one of the cross intersection modular floor element, and wherein the raisable floor has an raisable floor upper surface.

According to still another feature of the present invention each one of the inner elongated modular floor elements includes: (i) an inner elongated modular floor element ballasting receptacle portion, that can contain fluids, the inner elongated modular floor element ballasting receptacle portion having at least one top facet of inner elongated modular floor element ballasting receptacles; (ii) an inner elongated modular floor element upper portion, disposed on the inner elongated modular floor element ballasting receptacle portion; and (iii) an elongated flotation fluid conducting tubing mounted inside the inner elongated modular floor element upper portion.

According to still another feature of the present invention each one of the peripheral elongated modular floor elements includes: (i) a peripheral elongated modular floor element ballasting receptacle portion, that can contain fluids, the peripheral elongated modular floor element ballasting receptacle portion has at least one top facet of peripheral elongated modular floor element ballasting receptacle portion; (ii) a peripheral elongated modular floor element upper portion, disposed on the peripheral elongated modular floor element ballasting receptacle portion; and (iii) a peripheral elongated flotation fluid conducting tubing module mounted inside the peripheral elongated modular floor element upper portion.

According to still another feature of the present invention each one of the cross intersection modular floor element includes: (i) a cross intersection modular floor element ballasting receptacle portion, that can contain fluids, the cross intersection modular floor element ballasting receptacle portion having at least one top facet of cross intersection modular floor element ballasting receptacle portions; (ii) a cross intersection modular floor element upper portion, disposed on the cross intersection modular floor element ballasting receptacle portion; and (iii) a cross intersection flotation fluid conducting tubing module mounted inside the cross intersection modular floor element upper portion.

According to still another feature of the present invention each one of the T-intersection modular floor element includes: (i) a T-intersection modular floor element ballasting receptacle portion, that can contain fluids, the T-intersection modular floor element ballasting receptacle portion having at least one top facet of ballasting receptacle portion of T-intersection modular floor element ballasting receptacle portion; (ii) a T-intersection modular floor element upper portion, disposed on the T-intersection modular floor element ballasting receptacle portion; and (iii) a T-intersection flotation fluid conducting tubing module mounted inside the T-intersection modular floor element upper portion.

According to still another feature of the present invention each one of the corner modular floor element includes: (i) a corner modular floor element ballasting receptacle portion, that can contain fluids, the corner modular floor element ballasting receptacle portion, having at least one top facet of ballasting receptacle portion of corner modular floor; (ii) a corner modular floor element upper portion, disposed on the corner modular floor element ballasting receptacle portion; and (iii) a corner flotation fluid conducting tubing module mounted inside the corner modular floor element upper portion.

According to still another feature of the present invention the rapid elevation floor system further includes: (B) at least one flooring tile lying, at least partially, on the top facet of ballasting receptacle portion of corner modular floor, wherein the flooring tile has at least one drainage hole.

According to still another feature of the present invention the rapid elevation floor system further includes: (B) at least one flooring tile lying at least on two top facets selected from a group consisting of two top facets of peripheral elongated modular floor element ballasting receptacle portions, two top facets of cross intersection modular floor element ballasting receptacle portion, two top facets of ballasting receptacle portions of T-intersection modular floor element ballasting receptacle portions, and two top facets of ballasting receptacle portions of corner modular floor element ballasting receptacle portions, wherein the flooring tile has at least one drainage hole.

According to still another feature of the present invention the inner elongated modular floor element further includes: (iv) a ballasting receptacle inner volume located inside the inner elongated modular floor element ballasting receptacle portion; (v) a flotation fluid discharge valve securely connected to the inner elongated modular floor element ballasting receptacle portion, in a way that enables a selective discharge of a flotation fluid from the ballasting receptacle inner volume; and (vii) a one way check valve securely connected to the inner elongated modular floor element ballasting receptacle portion in a way that enables a fluid flow from the inner elongated modular floor element upper portion into the ballasting receptacle inner volume, and blocks a fluid flow from the ballasting receptacle inner volume, into inner elongated modular floor element upper portion.

According to still another feature of the present invention the inner elongated modular floor element further includes: (viii) a partition barrier disposed inside the inner elongated modular floor element ballasting receptacle portion.

According to still another feature of the present invention the inner elongated modular floor element further includes: (ix) at least one opening located at a bottom of the inner elongated modular floor element ballasting receptacle portion; and (x) a stretching sleeve disposed on the inner elongated modular floor element ballasting receptacle portion in a way that enables a fluid flow through the opening from the ballasting receptacle inner volume into the stretching sleeve and from the stretching sleeve into the ballasting receptacle inner volume, wherein the stretching sleeve includes at least one stretching sleeve hole.

According to still another feature of the present invention the inner elongated modular floor element further includes: (ix) at least one opening located at a bottom of the inner elongated modular floor element ballasting receptacle portion; and (x) a flotation bag disposed on the inner elongated modular floor element ballasting receptacle portion in a way that enables a fluid flow through the opening from the ballasting receptacle inner volume into the flotation bag and from the flotation bag into the ballasting receptacle inner volume.

According to still another feature of the present invention the peripheral elongated modular floor element further includes: (iv) a cushion disposed on the peripheral elongated modular floor element ballasting receptacle portion outer facet.

According to still another feature of the present invention the cross intersection flotation fluid conducting tubing module includes a set of x-flotation fluid conducting tubes, a set of y-flotation fluid conducting tubes, and a set of flotation fluid conducting valves, wherein each of the flotation fluid conducting valves are coupled between an x-flotation fluid conducting tube, and a y-flotation fluid conducting tube.

According to still another feature of the present invention at least one of the cross intersection flotation fluid conducting tubing modules is operatively connected to one elongated flotation fluid conducting tubing in a way that enables a direct fluid flow from tubes of the cross intersection flotation fluid conducting tubing module into tubes of the elongated flotation fluid conducting tubing.

According to still another feature of the present invention the rapid elevation floor system further includes: (C) a manifold; (D) a flotation fluid source; (E) a flotation fluid source tube; and (F) at least two manifold tubes, wherein the manifold is in fluid connection with the raisable floor, through the flotation fluid source tube, and wherein the flotation fluid source is in fluid connection with the manifold through the manifold tubes.

According to still another feature of the present invention the flotation fluid source is a compressor.

According to still another feature of the present invention the raisable floor further includes: (f) at least one pressure sensor disposed on the raisable floor upper surface; and (g) at least one second type sensor selected from a group consisting of hydrophone sensor, energy sensor, and location sensor, disposed on the raisable floor upper surface.

According to still another feature of the present invention the rapid elevation floor system further includes: (I) a human machine interface; and (J) a command and control unit, wherein the human machine interface is operatively connected to the command and control unit, and wherein the human machine interface is operatively connected to a second type of sensors.

According to still another feature of the present invention the raisable floor contains an amount of flotation fluid, and wherein the command and control unit commands and controls the amount of flotation fluid.

According to still another feature of the present invention the rapid elevation floor system has a standby mode of operation, and wherein at the standby mode of operation the raisable floor and the amount of flotation fluid have an average specific weight of at most one gram per cubic centimeter.

According to still another feature of the present invention the raisable floor comprises at least two volume sections, wherein the command and control unit commands and controls a selective pressure of flotation fluid at the volume sections.

According to still another feature of the present invention the raisable floor includes: (i) at least two modular floor elements, wherein at least some of which include a ballasting receptacle, the ballasting receptacle being adapted to receive and discharge a volume of a flotation fluid; and (ii) a flotation fluid conducting tubing in fluid connection with the ballasting receptacle, wherein the flotation fluid conducting tubing of at least one the modular floor element is in fluid connection with the flotation fluid conducting tubing of at least three other of the modular floor elements, for forming a continuous flotation fluid conducting tubing.

According to still another feature of the present invention the rapid elevation floor system including no hydraulic sub-system, and no metal components and wherein the rapid elevation floor system including no moving support elements.

According to still another feature of the present invention the raisable floor includes at least one manhole wherein the manhole has a manhole circle having a manhole circle diameter value, wherein the manhole circle diameter value has at least a manhole circle diameter predetermined value, wherein the flooring tile has a flooring tile weight value, wherein the flooring tile weight value has at most tile weigh predetermined value, wherein the flooring tile has a tile specific gravity less than 1.0.

According to the present invention there is provided a method for assembling a rapid elevation floor system in a pool, the method comprising the stages of: (a) assembling a raisable floor inside the pool; (b) adding sensors to the raisable floor, and connecting the raisable floor platform to auxiliary units; (c) laying flooring tiles on the raisable floor; and (d) sinking the raisable floor platform to a bottom of the pool.

According to another feature of the present invention the stage of assembling a raisable floor inside the pool includes the sub-stages of: (i) laying a corner modular floor element on the water; (ii) laying two peripheral elongated modular floor elements and connected them to the corner modular floor element; (iii) laying a T-intersection modular floor element and connected it to a peripheral elongated modular floor element; (iv) laying an inner elongated modular floor element and connecting it to a peripheral elongated modular floor element; and (v) laying a cross intersection modular floor element and connecting it to an inner elongated modular floor element; and wherein the stage of sinking the raisable floor platform to a bottom of the pool includes the sub-stages of: (i) operatively connecting a human-machine interface, a command and control unit, a flotation fluid source, and a manifold to the raisable floor; and (ii) operatively connecting a second type sensor and a pressure sensor to the raisable floor.

According to the present invention there is provided a method for rapid and controlled elevation of a raisable floor in a pool, the method comprising the stage of: (a) elevating a raisable floor to a water surface in the pool, wherein the floor system includes: (i) at least two modular floor elements, wherein at least some of which include a ballasting receptacle inner volume, the ballasting receptacle inner volume being adapted to receive and discharge a volume of a flotation fluid; and (ii) a flotation fluid conducting tubing in fluid connection with the ballasting receptacle inner volume, wherein the flotation fluid conducting tubing of at least one modular floor element is in fluid connection with the flotation fluid conducting tubing of at least three other of the modular floor elements, for forming a continuous flotation fluid conducting tubing.

According to still another feature of the present invention, the stage of elevating a raisable floor to a water surface in the pool includes the sub-stages of: (i) keeping a predetermined amount of flotation fluid inside ballasting receptacle inner volumes of the raisable floor for controlling a raisable floor specific gravity, wherein the raisable floor is laying on a pool bottom; (ii) infusing flotation fluid inside the ballasting receptacle inner volumes of the raisable floor for controlled elevation of the raisable floor; (iii) measuring modular floor elements depth difference inside the water among certain of the at least two modular floor elements; (iv) balancing the raisable floor by infusing controlled amount of flotation fluid into the ballasting receptacle inner volumes; and (v) limiting a movement of air within the ballasting receptacle inner volume according to modular floor elements depths, for the purpose of improving a stability of the raisable floor and its controllability.

According to still another feature of the present invention the method for rapid and controlled elevation of a raisable floor further comprising the stage of: (b) before elevating the raisable floor, detecting an unusual situation inside the water of the pool.

According to still another feature of the present invention the stage of detecting an unusual situation inside the water of the pool includes the sub-stages of: (i) receiving a signals from at least one sensor; and (ii) recognizing the signals as a result from an emergence situation.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 8a is an isometric schematic illustration of an illustrative, exemplary embodiment of a cross intersection modular floor element upper portion, according to the present invention;

FIG. 8b is a front view schematic illustration of an illustrative, exemplary embodiment of an intersection of an x-flotation fluid conducting tube, a y-flotation fluid conducting tub, and a flotation fluid conducting valve, of a cross intersection modular floor element upper portion, according to the present invention;

FIG. 9a is a top view schematic illustration of an illustrative, exemplary embodiment of a raisable floor platform, according to the present invention;

Figure 1:
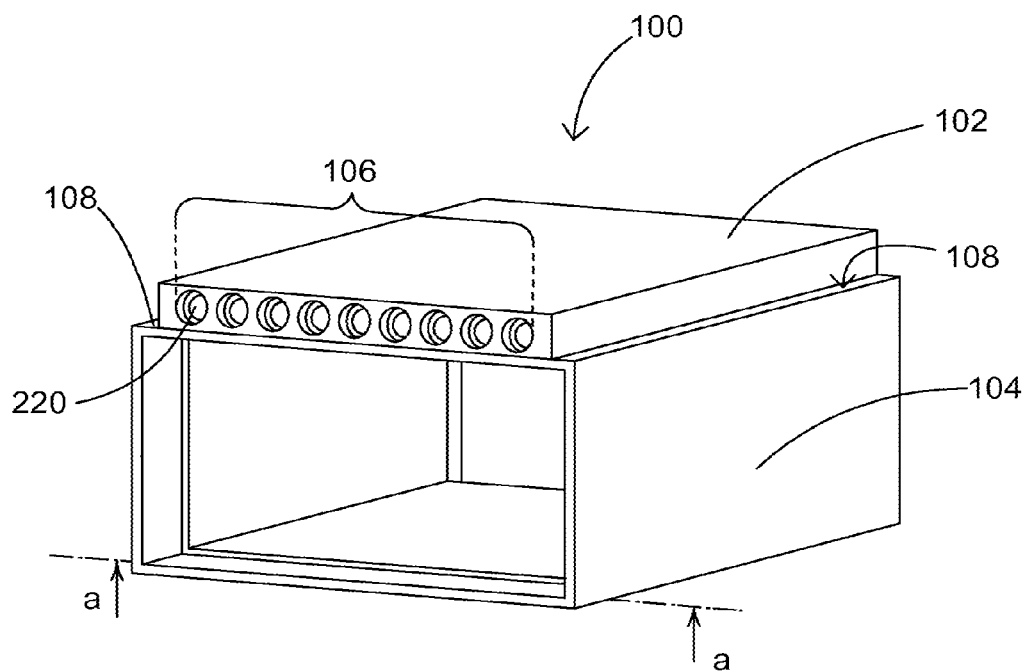
FIG. 1 is an isometric schematic illustration of an illustrative, exemplary embodiment of an inner elongated modular floor element, according to the present invention, upon which the section plane a-a is marked.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS

The present invention includes a method and system for rapid and controlled elevation of a raisable floor for pools. The principles and operation of a rapid elevation floor system according to the present invention may be better understood with reference to the drawings and the accompanying description.

Before explaining at least one embodiment of the invention in detail, it is to be understood that the invention is not limited in its application to the details of construction and the arrangement of the components set forth in the following description or illustrated in the drawings.

Unless otherwise defined, all technical and scientific terms used herein have the same meaning as commonly understood by one of ordinary skill in the art to which this invention belongs. The materials, dimensions, methods, and examples provided herein are illustrative only and are not intended to be limiting.

It will be noted that the manner in which the elements of the present invention are described in the illustrations can be highly detailed, however, these details are not intended as in any way limiting the present invention, but rather are provided for purposes of clarification and furthering understanding of the embodiments described. The present invention can be implemented in embodiments that differ from the below specification with regard to the illustrations.

The disclosed technique overcomes some or all disadvantages of the prior art, for example, by providing a system with decision-making capabilities and a method for rapid elevation floor system for rescuing a drowning person.

A raisable floor of the rapid elevation floor system may be modular, thereby enabling matching of the raisable floor to substantially any pool bottom. The modular elements of the raisable floor may be interconnected by an adhesive, by a mechanical force (e.g., by wedging a modular floor element between a plurality of surrounding modular floor elements, such that it is held by the surrounding modular floor elements), and the like.

The rapid elevation floor system may elevate the raisable floor by pumping a flotation fluid into at least one ballasting receptacle, thereby increasing the buoyancy of the raisable floor. By selectively discharging the flotation fluid from the ballasting receptacle, the buoyancy of the raisable floor decreases, thereby causing the raisable floor to sink. The modular rapid elevation floor system is designed to work in concert with a drowning detection system. Such systems which, for example are based on sonar signals exist in the market. Therefore, the raisable floor system of the current invention is an intelligent system with decision making capabilities (i.e., the system is self-operating and is capable of learning).

As used herein the specification and in the claims section that follows:

The term "pool" and the like refer to any aquatic container in which a person or an animal (i.e., a living creature) might be in danger of drowning, and specifically include swimming pools as the most common pools.

The term "drowning event" and the like refer to an occurrence which necessitates the raising of the raisable floor to rescue a possible drowning living creature.

The term "flotation fluid" and the like refers to a liquid or gas with a sufficiently low specific weight relative to that of the water occupying a pool, such that the flotation fluid floats to the surface of the water. The flotation fluid can be a gas, liquid, and the like (e.g., air, oil, and the like).

The term "flotation fluid pumping unit" and the like, refers to a device which discharges the flotation fluid into the raisable floor. For example, a compressor is most applicable if air is the flotation fluid. Another example includes a device which mixes chemical compounds which react there-between (namely, causes a controlled explosion) to rapidly produce a flotation fluid which may be conducted to the ballasting receptacles.

The term "ballasting receptacle inner volume" and the like, refers to a receptacle (which can contain a flotation fluid), such as the ballasting receptacle inner volumes of the inner elongated modular floor element, the peripheral elongated modular floor element, the cross intersection modular floor element, the T-intersection modular floor element, and the corner modular floor element.

The buoyancy of the ballasting receptacle is modified by the volume of the flotation fluid contained within the ballasting receptacle. When the ballasting receptacle is filled with water from the pool, the ballasting receptacle will sink. When the ballasting receptacle is filled with flotation fluid the ballasting receptacle will float.

The term "flotation bag" and the like refers to a closed elastic bag for containing the flotation fluid. The flotation bag operates in a substantially similar manner as the ballasting receptacle. The flotation fluid inflates the flotation bag, to increase the buoyancy of the flotation bag.

The term "manhole" and the like refers to an opening that allows an adult human to pass therethrough.

The following list is a legend of the numbering of the application illustrations:

10 profiles
20 connectors
30 utility units
100 inner elongated modular floor element
102 inner elongated modular floor element upper portion
104 inner elongated modular floor element ballasting receptacle portion 105 opening
106 elongated flotation fluid conducting tubing
107 flotation fluid (occupying the ballasting receptacle)
108 top facet of inner elongated modular floor element ballasting receptacle portion
110 ballasting receptacle inner volume
120 peripheral elongated modular floor element
122 peripheral elongated modular floor element upper portion
124 peripheral elongated modular floor element ballasting receptacle portion
126 peripheral elongated flotation fluid conducting tubing module
128 top facet of peripheral elongated modular floor element ballasting receptacle portion
130 cushion
131 stretching sleeve
131a stretching sleeve bottom
131b stretching sleeve hole
132 peripheral elongated modular floor element upper portion outer facet
134 peripheral elongated modular floor element ballasting receptacle portion outer facet
135 partition barrier
140 cross intersection modular floor element
142 cross intersection modular floor element upper portion
144 cross intersection modular floor element ballasting receptacle portion
146 cross intersection flotation fluid conducting tubing module
148 top facet of cross intersection modular floor element ballasting receptacle portion
160 T-intersection modular floor element
162 T-intersection modular floor element upper portion
164 T-intersection modular floor element ballasting receptacle portion
166 T-intersection flotation fluid conducting tubing module
168 top facet of ballasting receptacle portion of T-intersection modular floor element ballasting receptacle portion
180 corner modular floor element
182 corner modular floor element upper portion
184 corner modular floor element ballasting receptacle portion
186 corner flotation fluid conducting tubing module
188 top facet of ballasting receptacle portion of corner modular floor element ballasting receptacle portion
200 flooring tile
200W flooring tile weight
200LF flooring tile lifting force
200SF flooring tile side force
202 drainage hole
220 flotation fluid tubes
222 flotation fluid sub tube
224 one way check valve
226 flotation fluid discharge valve
252 x-flotation fluid conducting tube
254 y-flotation fluid conducting tube
256 flotation fluid conducting valve
270 raisable floor platform
280 raisable floor
281 raisable floor upper surface
304 volume section
344 flotation bag
400 auxiliary units
402 human-machine interface
404 command and control unit
406 flotation fluid source, (such a compressor)
408 manifold
502 second type sensor (hydrophones/energy/location sensor)
504 pressure sensor
600 modular floor elements
700 manhole
700x manhole side minimum dimension
700C manhole circle
700D manhole circle diameter
800 pool
801 pool wall
802 pool bottom
803 water
804 water surface
805 modular floor elements depth
1000 rapid elevation floor system When the accompanying description of a specific illustration mentions an element not shown in that illustration or without numbering, its numbering is shown in parentheses, and can be found in one or more other illustrations.

Referring now to the drawings, FIG. 1 is an isometric schematic illustration of an illustrative, exemplary embodiment of an inner elongated modular floor element 100, according to the present invention, upon which the section plane a-a is marked.

Inner elongated modular floor element 100 includes an inner elongated modular floor element upper portion 102, an inner elongated modular floor element ballasting receptacle portion 104, and an elongated flotation fluid conducting tubing 106. The inner elongated modular floor element upper portion 102 is coupled with a top facet of inner elongated modular floor element ballasting receptacle portion 108. The inner volume of inner elongated modular floor element ballasting receptacle portion 104 operates as a ballasting receptacle. The elongated flotation fluid conducting tubing 106 is incorporated with the inner elongated modular floor element upper portion 102, and is in fluid connection with the inner elongated modular floor element ballasting receptacle portion 104. Alternatively, the elongated flotation fluid conducting tubing 106 is separate from the inner elongated modular floor element upper portion 102, and is in fluid connection with the inner elongated modular floor element ballasting receptacle portion 104.

The inner elongated modular floor element upper portion 102 is in the shape of an elongated closed box. The inner elongated modular floor element ballasting receptacle portion 104 is in the shape of a box with at least one opening in the bottom facet. The length of the inner elongated modular floor element ballasting receptacle portion 104 is substantially the same as that of the inner elongated modular floor element upper portion 102. The width of the inner elongated modular floor element ballasting receptacle portion 104 is greater than that of the inner elongated modular floor element ballasting receptacle portion 102. Therefore, two plateaus are formed on the top facet of inner elongated modular floor element ballasting receptacle portion 108, which are vacant. The elongated flotation fluid conducting tubing 106 includes a plurality of flotation fluid tubes 220, composed of nine as shown in the configuration of the present illustration.

The elongated flotation fluid conducting tubing 106 is in fluid connection with other tubing modules, to form a continuous flotation fluid conducting tubing. The elongated flotation fluid conducting tubing 106 is in fluid connection with a flotation fluid source, (406) such a compressor, via the continuous flotation fluid conducting tubing. The elongated flotation fluid conducting tubing 106 conducts the flotation fluid from the flotation fluid source (406), to the inner elongated modular floor element ballasting receptacle portion 104 and to the continuous flotation fluid conducting tubing.

The inner elongated modular floor element ballasting receptacle portion 104 receives the flotation fluid (107) from the elongated flotation fluid conducting tubing 106, as described herein below with reference to FIG. 7a, to increase the buoyancy of the inner elongated modular floor element 100. The flotation fluid (107) pushes the water of the pool out of the inner elongated modular floor element ballasting receptacle portion 104 through the at least one opening in the bottom facet of the inner elongated modular floor element ballasting receptacle portion 104. Inner elongated modular floor element ballasting receptacle portion 104 contains the flotation fluid inner elongated modular floor element ballasting receptacle portion 104 can discharge the flotation fluid (107), as described herein below with reference to FIG. 7a, to decrease the buoyancy of the inner elongated modular floor element 100. It is noted that, a flotation bag (344) can be coupled to the bottom facet of the inner elongated modular floor element ballasting receptacle portion 104 such that when filled with flotation fluid (107) it protrudes from the inner elongated modular floor element ballasting receptacle portion 104. The protruding flotation bag (344) can float on the surface of the water occupying the pool, thus elevating the inner elongated modular floor element ballasting receptacle portion 104 above the water surface.

Each modular floor element interconnects with other modular floor elements for forming a raisable floor platform 270. Each of the vacant plateaus, of the top facet of inner elongated modular floor element ballasting receptacle portion 108, supports a flooring tile 200 as described herein below with reference to FIG. 6.

It is noted that, the inner elongated modular floor element 100 as well as other modular floor elements, can be a single unit of cast plastic.

Figure 2:
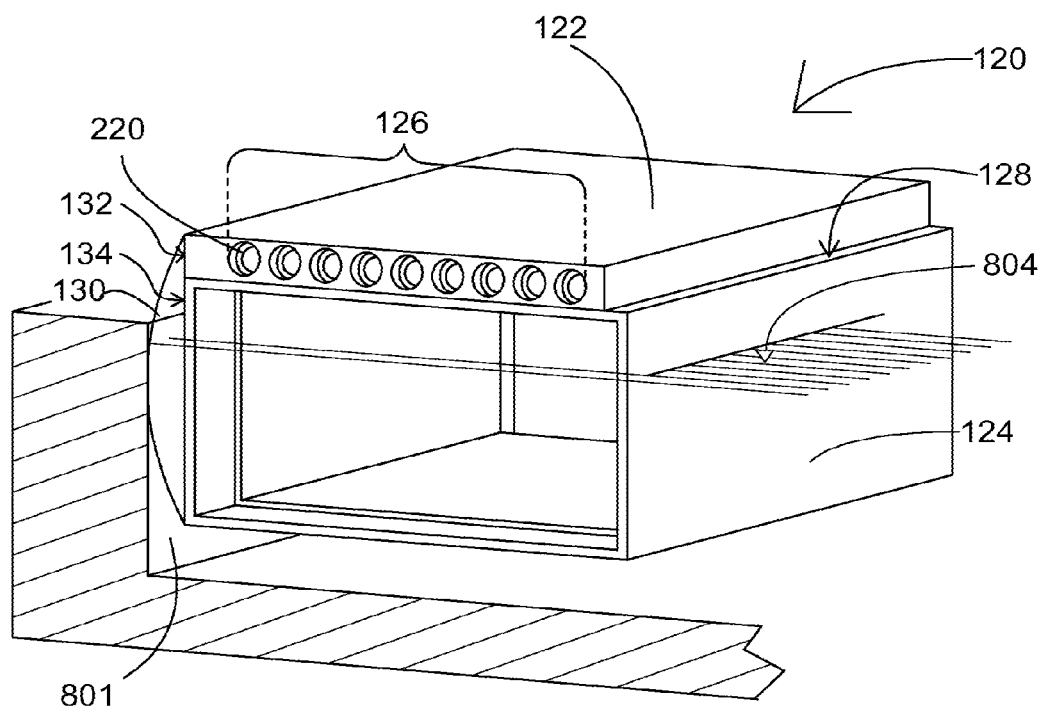
FIG. 2 is an isometric schematic illustration of an illustrative, exemplary embodiment of a peripheral elongated modular floor element, according to the present invention.

FIG. 2 is an isometric schematic illustration of an illustrative, exemplary embodiment of a peripheral elongated modular floor element 120, according to the present invention.

Peripheral elongated modular floor element 120 includes a peripheral elongated modular floor element upper portion 122, peripheral elongated modular floor element ballasting receptacle portion 124, a peripheral elongated flotation fluid conducting tubing module 126, and cushion 130. The peripheral elongated modular floor element upper portion 122 is coupled with a top facet of peripheral elongated modular floor element ballasting receptacle portion 128. The peripheral elongated modular floor element ballasting receptacle portion 124 operates as a ballasting receptacle. The peripheral elongated flotation fluid conducting tubing module 126, is incorporated with the peripheral elongated modular floor element upper portion 122, and is in fluid connection with the peripheral elongated modular floor element ballasting receptacle portion 124. Alternatively, the peripheral elongated flotation fluid conducting tubing module 126 is separate from the peripheral elongated modular floor element upper portion 122, and is in fluid connection with the peripheral elongated modular floor element ballasting receptacle portion 124. The cushion 130 is coupled with a peripheral elongated modular floor element upper portion outer facet 132, i.e., the facet that faces a wall of a pool) and with a peripheral elongated modular floor element ballasting receptacle portion outer facet 134.

Alternatively, cushion 130 is coupled with the peripheral elongated modular floor element upper portion outer facet 132.

The peripheral elongated modular floor element upper portion 122 is in the shape of an elongated closed box. The peripheral elongated modular floor element ballasting receptacle portion 124 is in the shape of a box with at least one opening in the bottom facet. The length of the peripheral elongated modular floor element ballasting receptacle portion 124 is substantially the same length as that of the peripheral elongated modular floor element upper portion 12. The width of the peripheral elongated modular floor element ballasting receptacle portion 124 is greater than that of the peripheral elongated modular floor element upper portion 122. Therefore, a plateau is formed on the top facet of peripheral elongated modular floor element ballasting receptacle portion 128, which is vacant. The peripheral elongated flotation fluid conducting tubing module 126 includes a plurality of flotation fluid tubes 220, composed of nine in the configuration of the present illustration.

The peripheral elongated flotation fluid conducting tubing module 126 is in fluid connection with other tubing modules to form a continuous flotation fluid conducting tubing. The peripheral elongated flotation fluid conducting tubing module 126 is in fluid connection with a flotation fluid source (406), via the continuous flotation fluid conducting tubing. The peripheral elongated flotation fluid (107) conducting tubing module 126 conducts the flotation fluid from the flotation fluid source (406), such as a compressor to the peripheral elongated modular floor element ballasting receptacle portion 124 to the continuous flotation fluid conducting tubing 220.

The peripheral elongated modular floor element ballasting receptacle portion 124 operates in substantially the same manner as the inner elongated modular floor element ballasting receptacle portion 104, and can also be coupled with a flotation bag. A cushion 130 softens possible bruising of body parts of a person that may be caught between the pool wall and the peripheral elongated modular floor element 120.

The peripheral elongated modular floor element 120 interconnects with other modular floor elements for forming the raisable floor surface. The vacant plateau, of the top facet of peripheral elongated modular floor element ballasting receptacle portion 128, supports a flooring tile 200.

It is noted that the peripheral elongated modular floor element 120, as well as other modular floor elements, can be a single unit of cast plastic.

The present illustration shows a state in which the cushion 130 is in contact with a pool wall 801, with which horizontal side force and vertical friction force can be maintained. The illustration also shows water surface 804, in the present case, with part of the peripheral elongated modular floor element 120 protruding above it.

Figure 3:
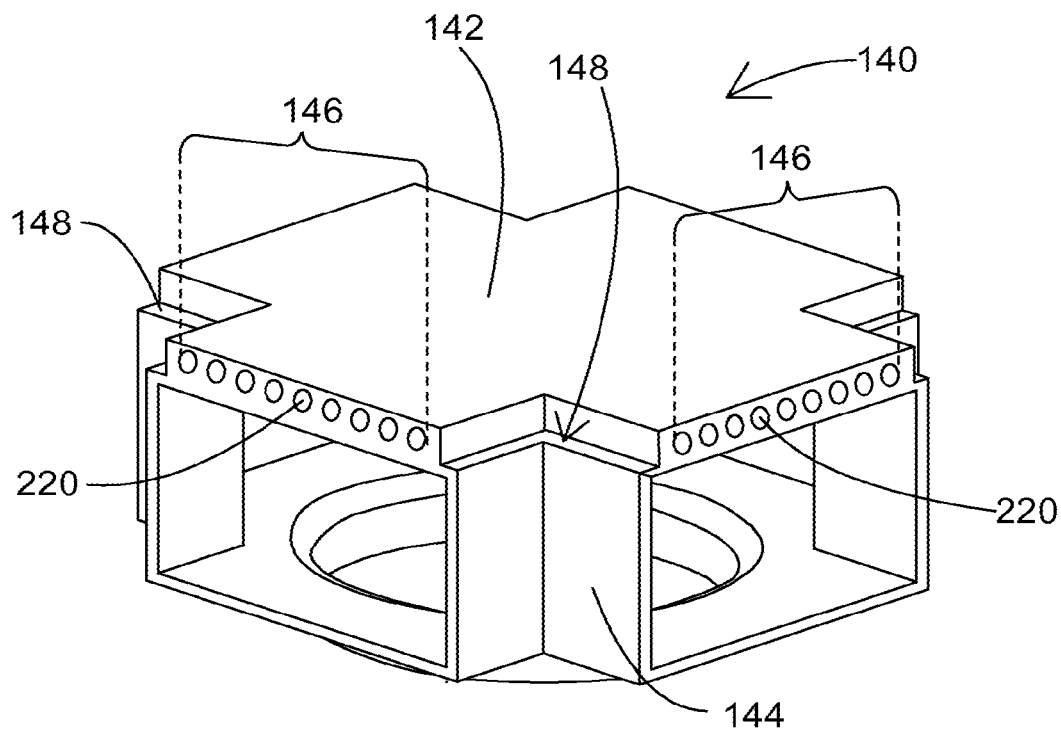
FIG. 3 is an isometric schematic illustration of an illustrative, exemplary embodiment of a cross intersection modular floor element, according to the present invention.

FIG. 3 is an isometric schematic illustration of an illustrative, exemplary embodiment of a cross intersection modular floor element 140, according to the present invention.

The cross intersection modular floor element 140 includes a cross intersection modular floor element upper portion 142, a cross intersection modular floor element ballasting receptacle portion 144, and a cross intersection flotation fluid conducting tubing module 146. The cross intersection modular floor element upper portion 142 is coupled with a top facet of cross intersection modular floor element ballasting receptacle portion 148. The inner volume of cross intersection modular floor element ballasting receptacle portion 144 operates as a ballasting receptacle. A cross intersection flotation fluid conducting tubing module 146 is incorporated with the cross intersection modular floor element upper portion 142, and is in fluid connection with the cross intersection modular floor element ballasting receptacle portion 144. Alternatively, the cross intersection flotation fluid conducting tubing module 146 is separate from the cross intersection modular floor element upper portion 142, and is in fluid connection with the cross intersection modular floor element ballasting receptacle portion 144.

The cross intersection modular floor element upper portion 142 is in the shape of a cross. The cross intersection modular floor element ballasting receptacle portion 144 is in the shape of a box with at least one opening in the bottom facet. The length and the width of the cross intersection modular floor element ballasting receptacle portion 144 are substantially the same as the length and the width of the arms of the cross intersection modular floor element upper portion 142, respectively.

The external dimensions of the top facet of cross intersection modular floor element ballasting receptacle portion 148 is larger than that of the bottom facet of the cross intersection modular floor element upper portion 142, as shown in the present illustration, therefore four plateaus are formed the top facet of cross intersection modular floor element ballasting receptacle portion 148, which are vacant. The cross intersection flotation fluid conducting tubing module 146 includes a plurality of flotation fluid tubes 220. In the cross configuration of the present illustration the ends of groups of nine flotation fluid tubes 220 each are shown, whereas each group is practically perpendicular to the other group.

Each one of two cross intersection flotation fluid conducting tubing modules 146 is in fluid connection with other tubing modules to form a continuous flotation fluid conducting tubing. The cross intersection flotation fluid conducting tubing module 146 is in fluid connection with a flotation fluid source 406 unit via the continuous flotation fluid conducting tubing. The cross intersection flotation fluid conducting tubing module 146 conducts the flotation fluid from the flotation fluid source 406 to the cross intersection modular floor element ballasting receptacle portion 144 and to the continuous flotation fluid conducting tubing 220.

The cross intersection modular floor element ballasting receptacle portion 144 operates in substantially the same manner as the inner elongated modular floor element ballasting receptacle portion 104, and can also be coupled with a flotation bag 344. The cross intersection modular floor element 140 interconnects with other modular floor elements for forming the raisable floor platform 270. Each of the vacant plateaus, of the top facet of cross intersection modular floor element ballasting receptacle portion 148 supports a flooring tile. It is noted that the cross intersection modular floor element 140, as well as other modular floor elements, can be a single unit of cast plastic.

Figure 4:
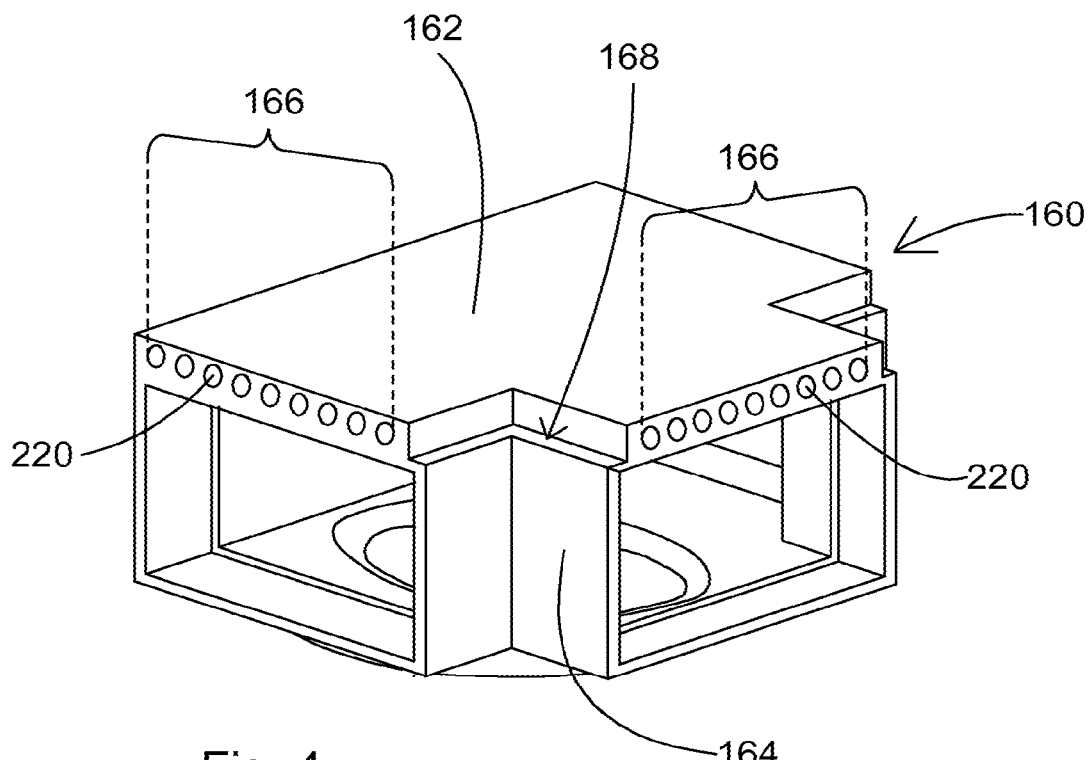
FIG. 4 is an isometric schematic illustration of an illustrative, exemplary embodiment of a T-intersection modular floor element, according to the present invention.

FIG. 4 is an isometric schematic illustration of an illustrative, exemplary embodiment of a T-intersection modular floor element 160, according to the present invention.

The T-intersection modular floor element 160 includes a T-intersection modular floor element upper portion 162, a T-intersection modular floor element ballasting receptacle portion 164, and a T-intersection flotation fluid conducting tubing module 166. The T-intersection modular floor element upper portion 162 is coupled with a top facet of T-intersection modular floor element ballasting receptacle portion 168.

The inner volume of the T-intersection modular floor element ballasting receptacle portion 164 operates as a ballasting receptacle. The T-intersection flotation fluid conducting tubing module 166 is incorporated with the T-intersection modular floor element upper portion 162, and is in fluid connection with the T-intersection modular floor element ballasting receptacle portion 164. Alternatively, the T-intersection flotation fluid conducting tubing module 166 is separate from the T-intersection modular floor element upper portion 162, and is in fluid connection with the T-intersection modular floor element ballasting receptacle portion 164.

The T-intersection modular floor element upper portion 162 is T-shaped. The T-intersection modular floor element ballasting receptacle portion 164 is in the shape of a box with at least one opening in the bottom facet. The length and width of T-intersection modular floor element ballasting receptacle portion 164 are substantially the same as the length and width of the arms of the T of the T-intersection modular floor element upper portion 162. The surface area of top facet of ballasting receptacle portion of T-intersection modular floor element ballasting receptacle portion 168 is larger than that of the bottom facet the T-intersection modular floor element upper portion 162, therefore two plateaus are formed on the top facet of ballasting receptacle portion of T-intersection modular floor element ballasting receptacle portion 168, which are vacant. T-intersection flotation fluid conducting tubing module 166 includes a plurality of flotation fluid tubes 220. The configuration of the present illustration shows the ends of two groups of nine flotation fluid tubes 220 each, which are practically perpendicular to each other.

Each one of two T-intersection flotation fluid conducting tubing modules 166 is in fluid connection with other tubing modules to form a continuous flotation fluid conducting tubing. T-intersection flotation fluid conducting tubing module 166 is in fluid connection with a flotation fluid source 406 via the continuous flotation fluid conducting tubing. T-intersection flotation fluid conducting tubing module 166 conducts the flotation fluid from the flotation fluid source 406 to ballasting receptacle portion 164 and to the continuous flotation fluid conducting tubing.

The T-intersection modular floor element ballasting receptacle portion 164 operates substantially the same as the inner elongated modular floor element ballasting receptacle portion 104, and can also be coupled with a flotation bag 344.

The T-intersection modular floor element 160 interconnects with other modular floor elements for forming the raisable floor surface platform 270. Each of the vacant plateaus of a T-intersection modular floor element ballasting receptacle portion 168 supports a flooring tile 200.

It is noted that the T-intersection modular floor element 160, as well as other modular floor elements, can be a single unit of cast plastic.

Figure 5:
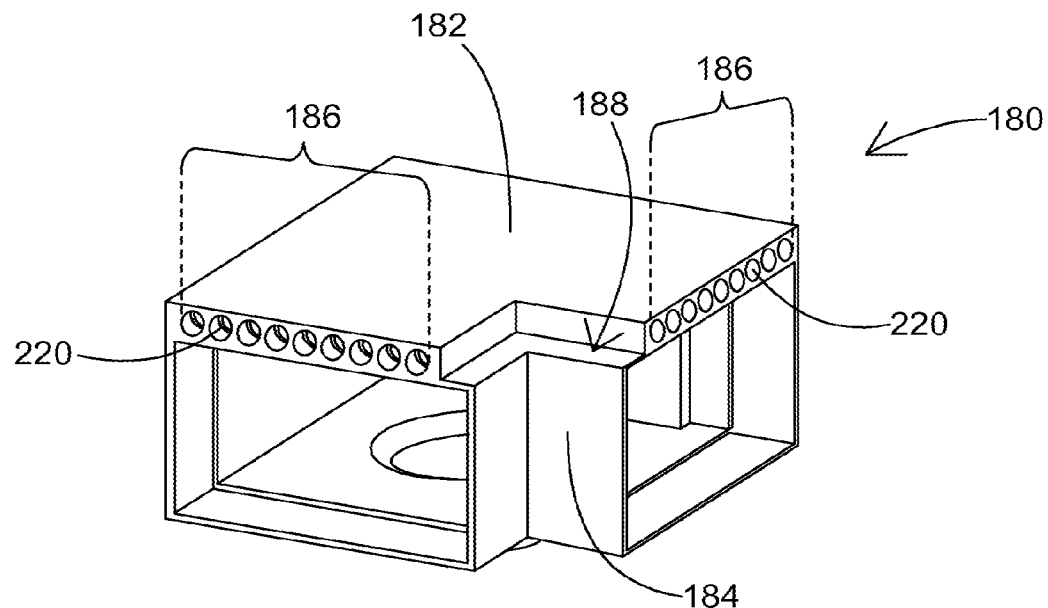
FIG. 5 is an isometric schematic illustration of an illustrative, exemplary embodiment of a corner modular floor element, according to the present invention.

FIG. 5 is an isometric schematic illustration of an illustrative, exemplary embodiment of a corner modular floor element 180, according to the present invention.

The corner modular floor element 180 includes a corner modular floor element upper portion 182, a corner modular floor element ballasting receptacle portion 184, and a corner flotation fluid conducting tubing module 186. The corner modular floor element upper portion 182 is coupled with a top facet of ballasting receptacle portion of corner modular floor element ballasting receptacle portion 188.

The top facet of ballasting receptacle portion of corner modular floor element ballasting receptacle portion 188 operates as a ballasting receptacle. The corner flotation fluid conducting tubing module 186 is incorporated with the corner modular floor element upper portion 182, and is in fluid connection with the corner modular floor element ballasting receptacle portion 184. Alternatively, the corner flotation fluid conducting tubing module 186 is separate from the corner modular floor element upper portion 182, and is in fluid connection with the corner modular floor element ballasting receptacle portion 184.

The corner modular floor element upper portion 182 is L-shaped. The corner modular floor element ballasting receptacle portion 184 is in the shape of a box with at least one opening in the bottom facet. The length and the width of the corner modular floor element ballasting receptacle portion 184 are substantially the same as the length and width of the arms of the L of the corner modular floor element upper portion 182. The surface area of the corner modular floor element ballasting receptacle portion 184 is larger than that of the corner modular floor element upper portion 182, therefore one plateau is formed on the top facet of ballasting receptacle portion of corner modular floor element ballasting receptacle portion 188, which is vacant. Each one of two corner flotation fluid conducting tubing module 186 includes a plurality of tubes. The configuration of the present illustration shows the ends of two groups of nine flotation fluid tubes 220 each, which are practically perpendicular to each other.

Each corner flotation fluid conducting tubing module 186 is in fluid connection with other tubing modules to form a continuous flotation fluid conducting tubing. Each corner flotation fluid conducting tubing module 186 is in fluid connection with a flotation fluid source 406 via the continuous flotation fluid conducting tubing. Each corner flotation fluid conducting tubing module 186 conducts the flotation fluid (107) from the flotation fluid source 406 to the corner modular floor element ballasting receptacle portion 184 and to the continuous flotation fluid conducting tubing.

The corner modular floor element ballasting receptacle portion 184 operates substantially the same as the inner elongated modular floor element ballasting receptacle portion 104, and can also be coupled with a flotation bag (344). The corner modular floor element 180 interconnects with other modular floor elements and a different corner modular floor element 180, for forming the raisable floor upper surface 281. The vacant plateau of the ballasting receptacle portion of corner modular floor element ballasting receptacle portion 188 supports a flooring tile 200.

It is noted that the corner modular floor element 180, as well as other modular floor elements, can be a single unit of cast plastic.

Figure 6:
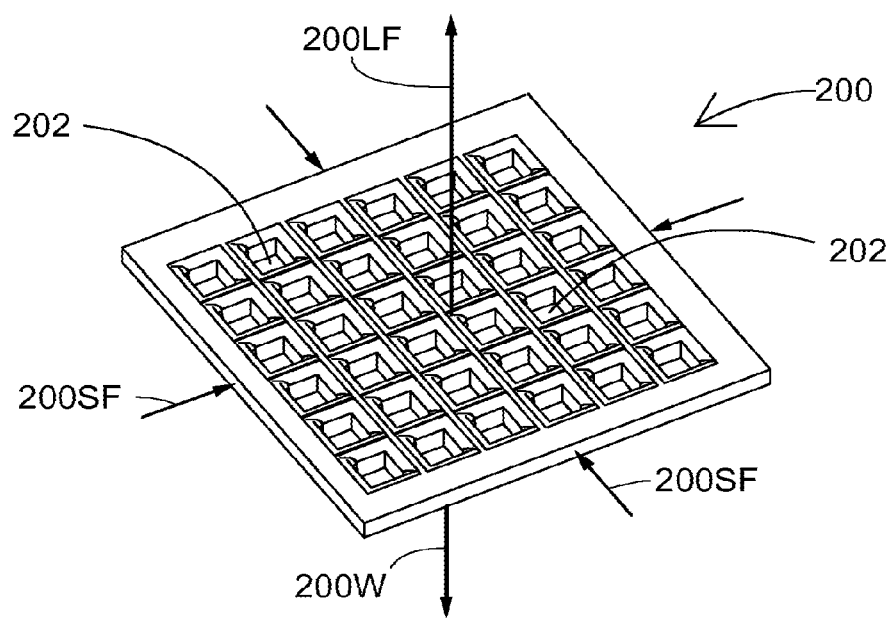
FIG. 6 is an isometric schematic illustration of an illustrative, exemplary embodiment of a flooring tile, according to the present invention.

FIG. 6 is an isometric schematic illustration of an illustrative, exemplary embodiment of a flooring tile 200, according to the present invention.

Flooring tile 200 includes a plurality of drainage holes 202. Drainage holes 202 are detachably coupled with other modular floor elements for forming raisable floor upper surface 281. Flooring tile 200 is wedged between at least two opposing other modular floor elements, such that when the raisable floor 280, (not shown in the present drawing, shown in FIG. 9b), is sinking underwater, the buoyancy of flooring tile 200 is too weak to pull flooring tile 200 out of the raisable floor 280. Preferably, flooring tile 200 is wedged between four opposing other modular floor elements. A child can detach flooring tile 200 from the raisable floor 280 by pushing a flooring tile 200, if he is accidentally caught underneath the raisable floor 280.

For this purpose, the flooring tile weight 200W of each flooring tile 200 is limited to a predetermined maximum value, such as 2 kilograms.

An additional desired feature of the flooring tile 200 is floatability in water. The flooring tile 200 preferably has a specific gravity (which by definition is dimensionless), smaller that of the pool water. Thus, if it is detached from raisable floor 280, which is immersed in the pool water, it will rise and float upon the water surface, and thus signal to people out of the water that something unusual has occurred.

Namely, the flooring tile specific gravity is preferably smaller than 1.0.

When the flooring tile 200 is installed as a part of raisable floor 280, the elements surrounding it apply horizontal flooring tile side forces 200SF. These forces ensure that the flooring tile 200 will not disconnect from its place and float to the water surface when the raisable floor 280 is immersed in the water.

The manner by which flooring tile 200 is held in place, and the manner by which it is released from this hold can also be by other means than as presently proposed.

Disconnection of flooring tile 200 from the raisable floor 280 requires the activation of flooring tile lifting force 200LF with an upwards component that will overcome these forces, and if it is not immersed in water, With regard to the flooring tile weight 200W as well, the geometrical dimensions, the shapes, and the friction coefficients creating the flooring tile side forces 200SF must be such that the needed flooring tile lifting force 200LF is within a predetermined range that is neither too small nor too large.

A human operator can detach flooring tile 200 from the raisable floor 280, by pulling the flooring tile 200, in order to make a manhole in the raisable floor 280, (e.g., an opening for inserting a cleaning robot into the pool). Drainage hole 202 enable water to drain there through them.

Figure 7A:
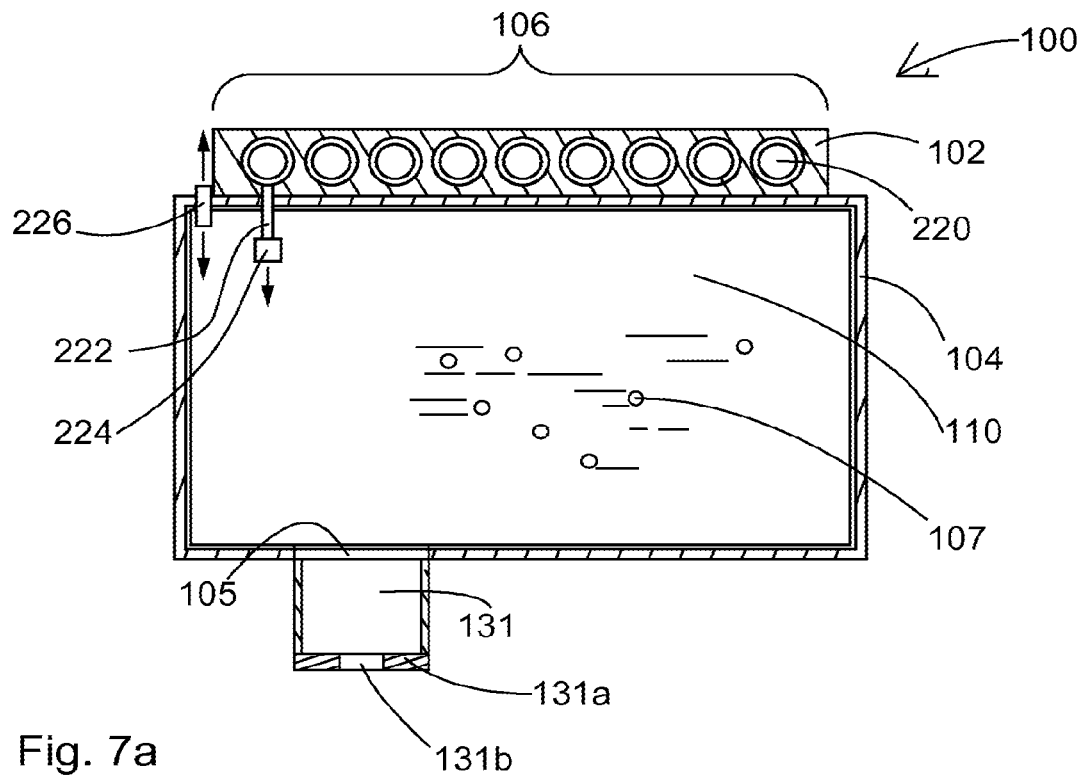
FIG. 7a is a cross sectional view a-a illustrative, exemplary embodiment of an inner elongated modular floor element, according to the present invention.

FIG. 7a is a cross sectional view a-a illustrative, exemplary embodiment of an inner elongated modular floor element 100, according to the present invention.

Inner elongated modular floor element 100 includes inner elongated modular floor element upper portion 102, inner elongated modular floor element ballasting receptacle portion 104, a plurality of flotation fluid tubes 220, a flotation fluid sub tube 222, a one way check valve 224, and a flotation fluid discharge valve 226.

Instead of a flotation fluid sub tube 222, a one way check valve 224 can be directly inserted into the applicable drill hole of flotation fluid tube 220.

The flotation fluid tubes 220, the flotation fluid sub tube 222, and the one way check valve 224 form together elongated flotation fluid conducting tubing 106. The one way check valve 224 is in the form of a valve which enables fluid flow from an inner elongated modular floor element upper portion 102 into inner elongated modular floor element ballasting receptacle portion 104, and blocks fluid flow from inner elongated modular floor element ballasting receptacle portion 104 into inner elongated modular floor element upper portion 102.

An inner elongated modular floor element upper portion 102 is coupled with an inner elongated modular floor element ballasting receptacle portion 104. A flotation fluid tube 220 is coupled with a flotation fluid sub tube 222. A flotation fluid sub tube 222 is coupled with a one way check valve 224. The flotation fluid discharge valve 226 is located on a top facet of inner elongated modular floor element ballasting receptacle portion 108.

The flotation fluid tubes 220 are in fluid connection with the continuous flotation fluid conducting tubing. A flotation fluid sub tube 222 enables the flow of flotation fluid 107 into the inner volume of elongated modular floor element ballasting receptacle portion 104, namely the ballasting receptacle inner volume 110, which operates as a ballasting receptacle. The flotation fluid discharge valve 226 enables selective discharge of the flotation fluid 107 from the inner elongated modular floor element ballasting receptacle portion 104.

The flotation fluid source (406), pumps flotation fluid 107 into the continuous flotation fluid conducting tubing. The flotation fluid tube 220 receives the flotation fluid 107 from the continuous flotation fluid conducting tubing. The flotation fluid sub tube 222 receives the flotation fluid 107 from flotation fluid tube 220. An inner elongated modular floor element ballasting receptacle portion 104 receives the flotation fluid 107 from a flotation fluid sub tube 222 and contains the flotation fluid 107 there within. The flotation fluid 107 fills the inner volume of an inner elongated modular floor element ballasting receptacle portion 104 and pushes the water of the pool out of the inner elongated modular floor element ballasting receptacle portion 104 via at least one opening 105 in the bottom facet of the inner elongated modular floor element ballasting receptacle portion 104. In order to fill an inner elongated modular floor element ballasting receptacle portion with flotation fluid 107, the flotation fluid source (406) can pump flotation fluid 107 only into flotation fluid tubes 220. In this manner by controlling which one of the flotation fluid tubes 220 receive flotation fluid 107, a controller can control which modular floor element will receive flotation fluid 107 and will float first. Alternatively, the inner elongated modular floor element ballasting receptacle portion 104 receives the flotation fluid 107 from more than one flotation fluid sub tube 222, which are coupled between the flotation fluid tubes 220 and the inner elongated modular floor element ballasting receptacle portion 104, via one flotation fluid discharge valve 226.

A flotation fluid discharge valve 226 discharges at least a portion of the flotation fluid 107 from an inner elongated modular floor element ballasting receptacle portion 104, to decrease the buoyancy of the inner elongated modular floor element 100.

The at least one opening 105 of the bottom facet of the inner elongated modular floor element 100 enables the flotation fluid 107 to push the water from of the ballasting receptacle inner volume 110, of the inner elongated modular floor element 100 into the pool. At least one opening 105 is under the water surface of the pool at all times. When the raisable floor 280, (not shown in the present drawing, shown in FIG. 9b), is elevated above the height of the water surface, each of at least one opening 105 is maintained under the water surface by employing an extension device extending from the at least one opening 105 to underneath the water surface of the pool, such that the at least one opening 105 will enable passage of the water from inner elongated modular floor element ballasting receptacle portion 104 into the water of the pool.

An extension device of the at least one opening 105 is in the form of a telescopic snorkel. Alternatively, the extension device is of a different form, such as a flexible sleeve, a rigid tube, and the like. It is further noted that elongated flotation fluid conducting tubing (106), is substantially similar to peripheral elongated flotation fluid conducting tubing module 126, cross intersection flotation fluid conducting tubing module 146, T-intersection flotation fluid conducting tubing module 166, and corner flotation fluid conducting tubing module 186.

Each opening 105 (the present illustration shows only one) is connected to a stretching sleeve 131 made of a flexible material with at least one stretching sleeve hole 131b at its bottom or side, for the purpose of draining water.

The stretching sleeve bottom 131a is made of a material which does not float in water, therefore when the inner elongated modular floor element 100, as a part of the raisable floor 280, is elevated above the water level, the openings of the stretching sleeve 131 will remain immersed in the water and maintain a suitable pressure within the ballasting receptacle inner volume 110, which will prevent air from escaping.

Figures 7B, 7C:
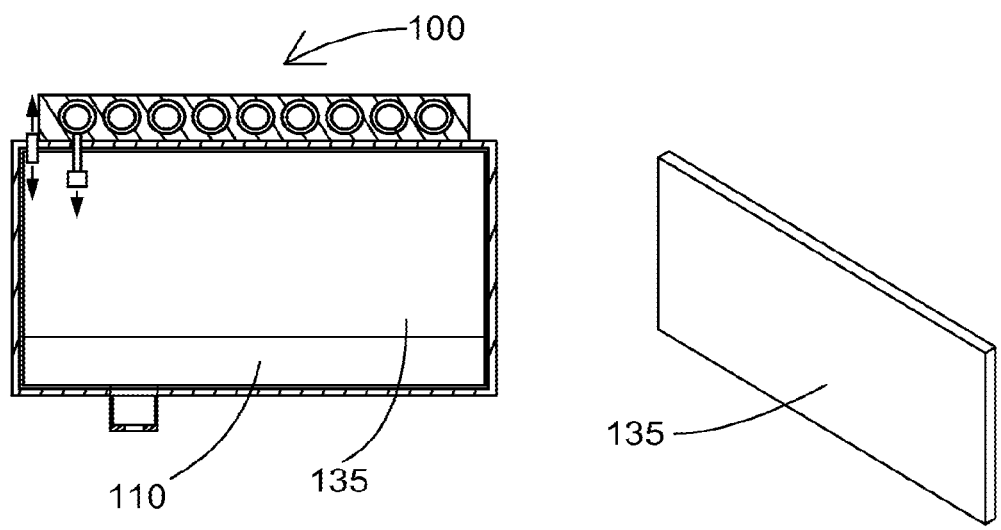
FIG. 7b is a cross sectional view a-a illustrative, exemplary embodiment of an inner elongated modular floor element, including a partition bather, according to the present invention.
FIG. 7c is an isometric view illustrative, exemplary embodiment of a partition barrier, according to the present invention.

FIG. 7b is a cross sectional view a-a illustrative, exemplary embodiment of an inner elongated modular floor element 100, including a partition barrier 135, according to the present invention. The designation of the partition barrier 135 is to limit the movement of air within the ballasting receptacle inner volume 110 as a result of angles that the inner elongated modular floor element 100 may reach, for the purpose of improving the stability of the raisable floor (280) and its controllability.

The partition barriers 135 are disposed within the ballasting receptacle inner volume 110, while being attached to its upper side and walls, leaving a gap between the barriers and its bottom.

FIG. 7c is an isometric view illustrative, exemplary embodiment of a partition barrier 135, according to the present invention.

FIG. 8a is an isometric schematic illustration of an illustrative, exemplary embodiment of a cross intersection modular floor element upper portion 142, according to the present invention.

The present illustration shows a Cartesian x-y coordinate system, which is practically on the same plane of the cross intersection modular floor element upper portion 142, and it serves the purpose of defining the directions in the illustration.

The set of the x-flotation fluid conducting tube 252, the set of y-flotation fluid conducting tube 254, and the flotation fluid conducting valves 256 are a part of cross intersection flotation fluid conducting tubing module 146.

Each flotation fluid conducting valves 256 is coupled between an x-flotation fluid conducting tube 252, and a y-flotation fluid conducting tube 254.

Each of the flotation fluid conducting valve 256 controls the passage of flotation fluid between an x-flotation fluid conducting tubes 252, and a y-flotation fluid conducting tube 254.

The flotation fluid conducting valves 256 are constant valves, which maintain their status of operation (i.e., open or closed valve). The status of operation of each of the flotation fluid conducting valves 256 is pre-determined The flotation fluid conducting valves 256 can be conical at both ends, to decrease flotation fluid turbulence during passage between the x-flotation fluid conducting tube 252, and the y-flotation fluid conducting tubes 254. Alternatively, the flotation fluid conducting valves 256 are coupled with a controller, which controls them, either automatically or according to an input from a user.

It is noted that, the flotation fluid conducting valves 256 enable quick passage of flotation fluid without unnecessary turbulence.

The configuration of the set of the x-flotation fluid conducting tubes 252, the set of y-flotation fluid conducting tubes 254, and the flotation fluid conducting valves 256, as described herein applies also to other modular floor elements which include two sets of flotation fluid conducting tubes, such as a T intersection modular floor element (160), and a corner modular floor element (180). This configuration applies to any number of flotation fluid conducting tubes greater than one.

Alternatively, other configurations can be employed. For example, at a point of intersection of a pair of flotation fluid conducting tubes (i.e., the pair includes one x-flotation fluid conducting tube 252, and one y-flotation fluid conducting tube 254), each of the flotation fluid conducting tubes can assume the shape of a half-cylinder. The half cylinder depression, in each of the flotation fluid conducting tubes, interconnects with the half cylinder depression of the other flotation fluid conducting tube. The flotation fluid conducting valve 256 is replaced by an opening on a common wall of the half cylinder depressions of the flotation fluid conducting tubes (i.e., the opening replaces an open valve and a solid common wall replaces a closed valve, thus the flotation fluid flow scheme is constant).

FIG. 8b is a front view schematic illustration of an illustrative, exemplary embodiment of an intersection of a x-flotation fluid conducting tube 252, a y-flotation fluid conducting tub 254, and a flotation fluid conducting valve 256, of a cross intersection modular floor element upper portion (142), according to the present invention.

Figure 9B:
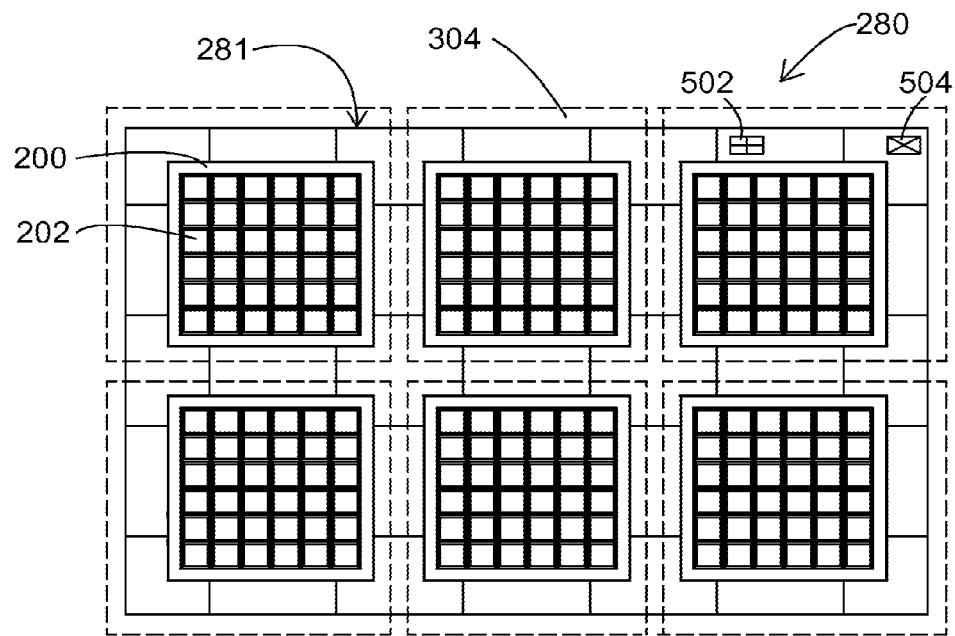
FIG. 9b is a top view schematic illustration of an illustrative, exemplary embodiment of a raisable floor, with flooring tiles, according to the present invention.

FIG. 9a is a top view schematic illustration of an illustrative, exemplary embodiment of a raisable floor platform 270, namely a raisable floor 280, (not shown in the present drawing, shown in FIG. 9b), without flooring tiles 200, and without any other accessories, according to the present invention.

The raisable floor platform 270 is produced by connection of the peripheral modules of peripheral elongated modular floor element 120, which are interconnected by means of T-intersection modular floor elements 160 and corner modular floor element 180.

T-intersection modular floor elements 160 connect to inner elongated modular floor element 100, which connect to cross intersection modular floor element 140, thus created a square grid with clear and sunken surfaces which are top facet of inner elongated modular floor element ballasting receptacle portion 108, top facet of peripheral elongated modular floor element ballasting receptacle portion 128, top facet of cross intersection modular floor element ballasting receptacle portion 148, top facet of ballasting receptacle portion of T-intersection modular floor element ballasting receptacle portion 168, and top facet of ballasting receptacle portion of corner modular floor element ballasting receptacle portion 188. These available and clear and sunken surfaces can carry flooring tiles (200).

The external dimensions from a top view of the floor elements, such as the inner elongated modular floor element 100, the peripheral elongated modular floor element 120, the cross intersection modular floor element 140, the T-intersection modular floor element 160, and the corner modular floor element 180, as well as their shapes and their positions relative to each other, ensure that a raisable floor platform 270 will include at least one manhole 700. The need for a manhole 700 has already been described in detail with regard to FIG. 6, note that the size and shape of each manhole 700 are designed to enable any or almost any person passage through it.

When a manhole 700 has a square section shape, the value of each manhole side minimum dimension 700x will be no smaller than a predetermined value. A recommended value is 70 centimeters. Another option for defining the dimensions of the manhole 700 is by it having a manhole circle 700c, which has a manhole circle diameter 700D, no smaller than a predetermined value.

FIG. 9b is a top view schematic illustration of an illustrative, exemplary embodiment of a raisable floor 280, with flooring tiles 200, according to the present invention.

When the flooring tiles 200 are fitted in place and their thickness is sufficient to provide the necessary rigidity and pressure when inserted as described, to the depth of the clear sunken surfaces described in the previous illustrations (as can be seen in FIG. 6), a raisable floor upper surface 281 is obtained, while it includes the upper faces of various elements of the raisable floor 280, such as those of the peripheral elongated modular floor elements 120, the cross intersection modular floor elements 140, the T-intersection modular floor elements 160, and the corner modular floor elements 180.

The flotation of each of the modular floor elements of the raisable floor 280 can be controlled, and the illustration shows a division by dotted lines into six volume sections 304, while it is also possible to divide into other numbers of volume sections 304. Each flooring tile 200 has drainage holes 202 which enable the passage of water. In addition, the corners of the raisable floor 280 can have installed pressure sensors 504 for the purpose of measurement and transmission of the depth of the corners in the water to the command and control unit (404). Likewise, the raisable floor 280 can have installed second type sensors such as hydrophones/energy/location sensors 502, to measure and transmit data of the occurrences in the pool to an early detection, location, and identification system.

Figures 10A, 10B:
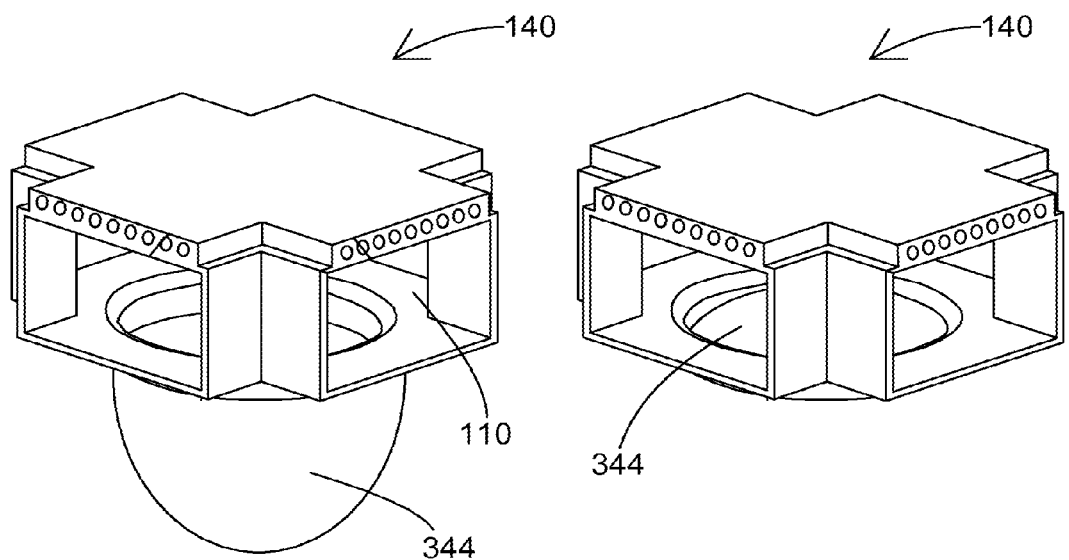
FIG. 10a is an isometric schematic illustration of an illustrative, exemplary embodiment of a cross intersection modular floor element with a flotation bag, full of flotation fluid, according to the present invention.
FIG. 10b is an isometric schematic illustration of an illustrative, exemplary embodiment of a cross intersection modular floor element with a flotation bag, empty of flotation fluid, according to the present invention.

FIG. 10a is an isometric schematic illustration of an illustrative, exemplary embodiment of a cross intersection modular floor element 140 with a flotation bag 344, full of flotation fluid (107), according to the present invention.

The cross intersection modular floor element 140 is coupled with a top facet of the flotation bag 344. It is noted that, flotation bag 344 cross section can be of any shape (e.g., circular, rectangular square, and the like). It is further noted that, flotation bag 344 can be coupled to other elements, as long as they have a suitable opening underneath, such as to inner elongated modular floor element 100, to peripheral elongated modular floor element 120, to cross intersection modular floor element 140, and to corner modular floor element 180.

The flotation bag 344 is in the form of a bag made of a polymer, such as nylon, polyethylene, and the like.

A flotation bag 344 enables the modular floor element to which it is connected to elevate above the water surface of the pool, by extending beyond the depth of a ballast receptacle.

A flotation bag 344 can connect to different kinds of openings, as necessary. Alternatively, it can be a standalone accessory that is connected to necessary locations, with independent air supply.

A flotation bag 344, in the configuration of the present illustration, receives air supply from ballasting receptacle inner volume 110. When inflation commences, the water is pressed out of the openings, and after all of the water is expelled, the air continues to expand to inflation of the flotation bag 344. With elevation of the raisable floor (280), the stretching sleeves (131) keep the water exhaust openings underwater, thus maintaining the pressure within the ballasting receptacle inner volume 110, so the flotation bags 344 inflate and keep lifting raisable floor (280).

FIG. 10b is an isometric schematic illustration of an illustrative, exemplary embodiment of a cross intersection modular floor element 140 with a flotation bag 344, empty of flotation fluid (107), according to the present invention.

Figure 11:
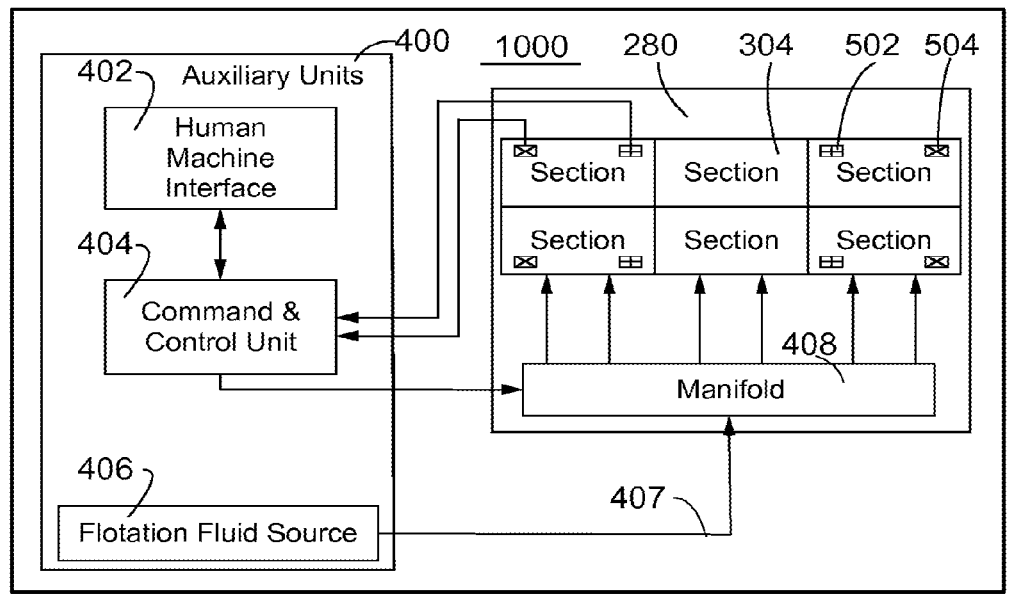
FIG. 11 is a flow chart that schematically illustrates the flow of sensor data, command and control signals, and pressures in a rapid elevation floor system, in accordance with an embodiment of the present invention.

FIG. 11 is a flow chart that schematically illustrates the flow of sensor data, command and control signals, and pressures in the rapid elevation floor system 1000, in accordance with an embodiment of the present invention.

The rapid elevation floor system 1000 includes auxiliary units 400, such as a human-machine interface 402, a command and control unit 404, and a flotation fluid source 406, which are all operatively connected to the raisable floor 280.

The raisable floor 280 is divided in the configuration of the present illustration into six volume sections 304, and the four corner sections contain second type sensor, such as hydrophones/energy/location sensors 502, and pressure sensors 504, which transmit the results of their measurements to command and control unit 404.

The command and control unit 404 receives and transmits signals from and to a human-machine interface 402, and also sends command signals to a manifold 408.

The manifold 408 is installed in a preselected location on raisable floor 280, such as one of its corners.

The manifold 408 receives pressures of the flotation fluid source 406 and feeds pressures of flotation fluid to the volume sections 304, as necessary.

Figure 12:
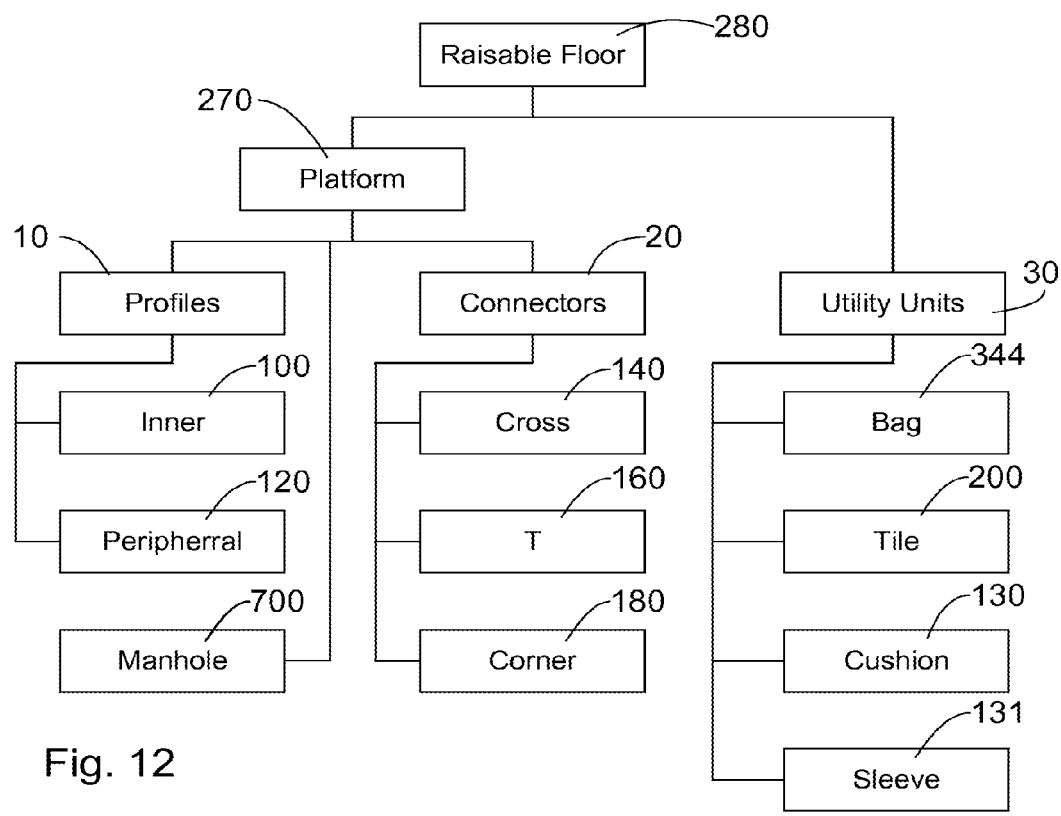
FIG. 12 is a schematic diagram showing the hierarchy of the sub-systems composing a raisable floor, according to the present invention.

FIG. 12 is a schematic diagram showing the hierarchy of the sub-systems composing raisable floor 280, according to the present invention.

The raisable floor 280 includes the raisable floor platform 270 and additional elements.

The raisable floor 280 can include profiles 10, connectors 20, and utility units 30.

The profiles 10 can include inner elongated modular floor elements 100, and peripheral elongated modular floor elements 120.

The connectors 20 can include cross intersection modular floor elements 140, T-intersection modular floor elements 160, and corner modular floor elements 180.

The utility units 30 can include flotation bags 344, flooring tiles 200, cushions 130, and stretching sleeves 131.

The raisable floor 280 also includes a plurality of manholes 700, disposed on a raisable floor platform 270, and no less than one manhole 700, even for a very small swimming pool.

Figure 13:
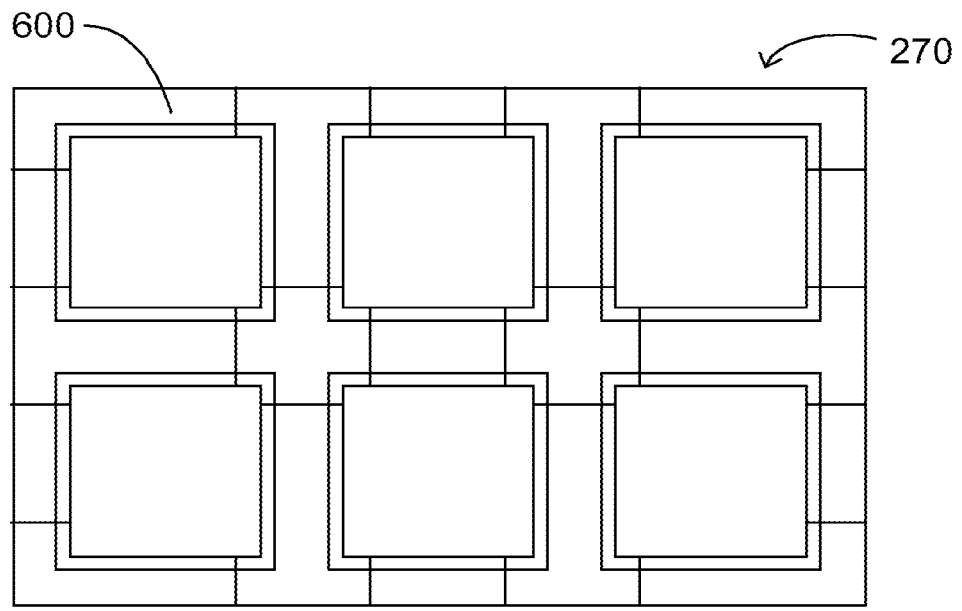
FIG. 13 is a top view schematic illustration of an illustrative, exemplary embodiment of a raisable floor platform namely a raisable floor without flooring tiles, and without any other accessories, according to the present invention.

FIG. 13 is a top view schematic illustration of an illustrative, exemplary embodiment of a raisable floor platform 270, namely a raisable floor (280) without flooring tiles 200, and without any other accessories, according to the present invention.

The present illustration shows many various possibilities for assembling a raisable floor platform 270 from a variety of modular floor elements 600 with many various shapes, from a top view.

Among the modular floor elements 600 are also the inner elongated modular floor element (100), the peripheral elongated modular floor element (120), the cross intersection modular floor element (140) the T-intersection modular floor element (160), and the corner modular floor element (180), all of which have been described in detail in previous illustrations, however the present invention is not limited strictly to their use.

The special features of the rapid elevation floor system, according to the present invention, resulting from its unique structure, also include the following:

Installment of the system in a pool does not require installation of construction or any other intervention with the pool's structure.

The system has no need for moving parts (other than internal components of the valves), such as support elements. The term "moving parts" here is used in reference to parts that move relative to other parts of the system, while it is obvious that parts of the system can move relative to the pool.

The system has no need for metal structure components.

The system has no need for a hydraulic system.

When air or water (803) flows through the system, it flows in parallel through several parts of the system, and without any need for emptying fluid from pipes, thus enabling fast and controlled response time during raising.

Figure 14:
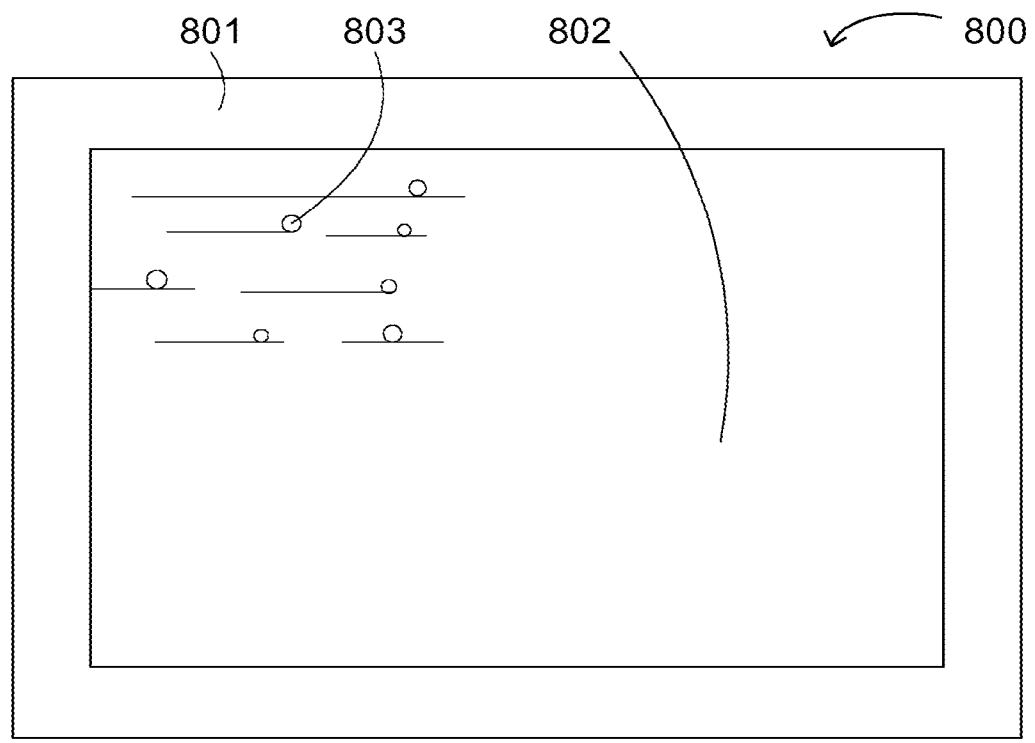
FIG. 14 is a top view of a pool.

FIG. 14 is a top view of a pool 800.

Pool 800 has pool walls 801, and a pool bottom 802, and there is water (803) inside of it. Installation of a rapid elevation floor system (1000) changes nothing in the structure of the pool 800, and if it is removed, no traces are left in the pool 800.

Figures 15, 16:
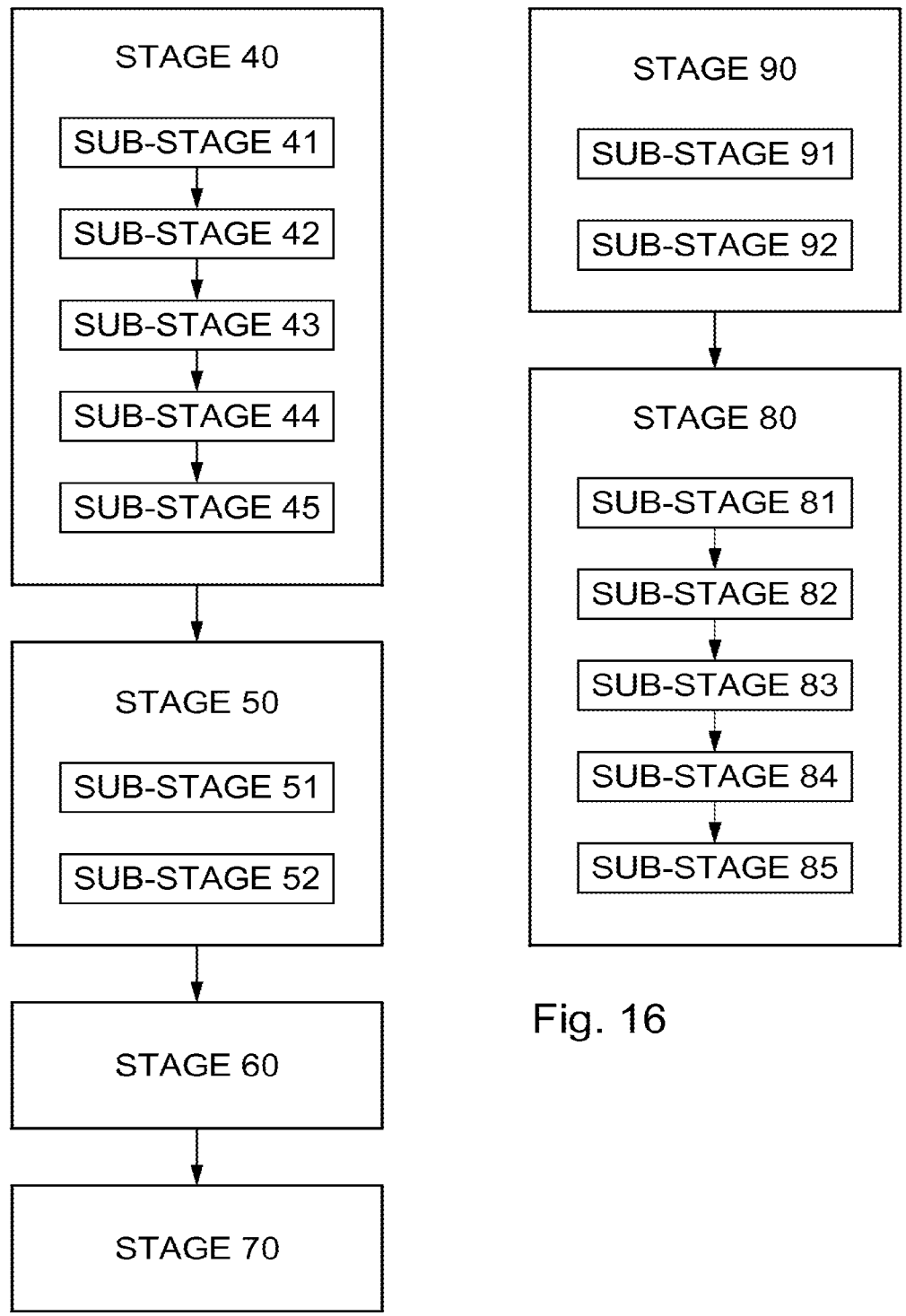
FIG. 15 is a flow chart schematically illustrating a method for assembling a rapid elevation floor system in a pool, according to the present invention.
FIG. 16 is a flow chart schematically illustrating a method for rapid and controlled elevation of a raisable floor in pool, according to the present invention.

FIG. 15 is a flow chart schematically illustrating a method for assembling a rapid elevation floor system in a pool containing water, according to the present invention, the method includes the stages of:

assembling a raisable floor (280) on the water (803) inside the pool, (stage 40);

adding sensors to the raisable floor (280), and connecting the raisable floor platform to auxiliary units (400), (stage 50);

laying flooring tiles (200) on the raisable floor (280) (stage 60); and sinking the raisable floor (280) to a bottom of the pool (stage 70).

The process of sinking to the floor of the pool includes draining air from spaces within raisable floor (280).

Stage 40 can include, without limiting the present invention in any way, the sub-stages of:

laying a corner modular floor element (180) on the water (803), (stage 41);

laying two peripheral elongated modular floor element (120) on the water (803) and connecting them to the corner modular floor element (180), (stage 42);

laying a T-intersection modular floor element (160) on the water (803) and connecting it to a peripheral elongated modular floor element (120), (stage 43);

laying an inner elongated modular floor element (100) on the water (803) and connecting it to a peripheral elongated modular floor element (120), (stage 44); and laying a cross intersection modular floor element (140) on the water (803) and connecting it to an inner elongated modular floor element (100), (stage 45).

Likewise, adding additional modular floor elements (600) until the entire area of the pool is covered with elements between which manholes (700) are formed.

All of the elements numbered and mentioned in this description appear in previous illustrations.

Stage 50 can include, without limiting the present invention in any way, the sub-stages of:

operatively connecting an human-machine interface (402), a command and control unit (404), a flotation fluid source (406), and a manifold (408), (stage 51); and operatively connecting a second type sensor (502), and a pressure sensor (504) to the raisable floor (280), (stage 51).

Cushions (130), which are connected to the external perimeter, from a top view, of the raisable floor (280) are made of material such as rubber with a high friction coefficient, and when they are inflated, they create friction with the internal walls of the pool. Thus, the raisable floor (280) can be locked to a certain depth.

FIG. 16 is a flow chart schematically illustrating a method for rapid and controlled elevation of a raisable floor (280) in a pool (800) according to the present invention, the method comprising the stage of:

elevating a raisable floor (280) to a water surface (804) in the pool (800), (stage 80), wherein the raisable floor (280) includes:

(i) at least two modular floor elements (600), wherein at least some of which include a ballasting receptacle inner volume (110), the ballasting receptacle inner volume (110) being adapted to receive and discharge a volume of a flotation fluid (107); and (ii) a flotation fluid conducting tubing (252, 254) in fluid connection with the ballasting receptacle inner volume (110), wherein the flotation fluid conducting tubing (252, 254) of at least one modular floor element (600) is in fluid connection with the flotation fluid conducting tubing (252, 254) of at least three other of the modular floor elements (600), for forming a continuous flotation fluid conducting tubing (252, 254).

Stage 80 can include, without limiting the present invention in any way, the sub-stages of:

(i) keeping a predetermined amount of flotation fluid (107) inside ballasting receptacle inner volumes (110) of the raisable floor (280) for controlling a raisable floor specific gravity, wherein the raisable floor (280) is laying on a pool bottom (802), (sub-stage 81).

The specific gravity is selected so that its value is only slightly higher than that of the water. This ensures that as long as raising is not being performed, the raisable floor (280) remains in contact with the pool bottom (802), while only a small quantity of flotation fluid (107) will need to flow in order to commence the raising process;

(ii) infusing flotation fluid (107) inside the ballasting receptacle inner volumes (110) of the raisable floor (280) for controlled elevation of the raisable floor (280) (sub-stage 82);

(iii) measuring modular floor elements depth (805) differences inside the water (803) among certain of the at least two modular floor elements (600), (sub-stage 83);

(iv) balancing the raisable floor (280) by infusing controlled amount of flotation fluid (107) into the ballasting receptacle inner volumes (110), (sub-stage 84); and (v) limiting a movement of flotation fluid (107) within the ballasting receptacle inner volumes (110), as a result of modular floor elements depth (805) differences, for the purpose of improving a stability of the raisable floor (280) and its controllability, (sub-stage 85).

The method for in pool can further comprising the stage of:

(b) before elevating the raisable floor (280), detecting an unusual situation inside the water (803) of the pool (800), (stage 90).

Stage 90 can include, without limiting the present invention in any way, the sub-stages of:

(i) receiving a signals from at least one sensor (502, 504), (sub-stage 91); and (ii) recognizing the signals as a result from an emergency situation, (sub-stage 92).

FIGS. 17a-17h is eight top view schematic illustrations showing various stages of placing elements upon the surface of the water 803, according to the present invention.

One good manner for installation is attaching parts to each other, when they are on the floor, near the edge of the pool, and pushing them into the water, while continuing to attach parts outside of the pool and push them in, until the entire pool is covered. A good manner for installation in the case of a rectangular pool is to perform the attachment near one of the short sides of the pool, one row after the other.

Figure 17A:
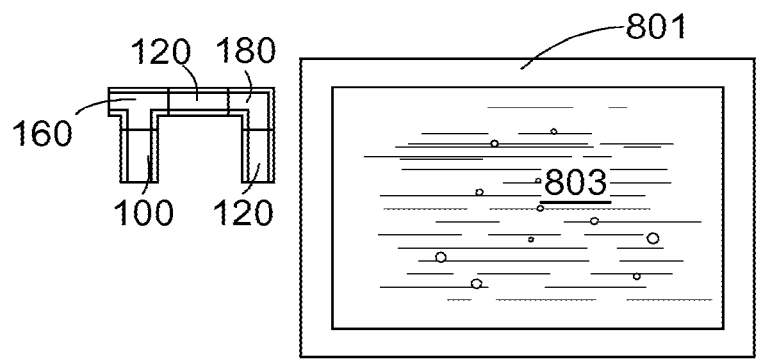
FIGS. 17a-17d are four top view schematic illustrations, showing various stages of placing elements upon the water surface, according to the present invention.

The state shown in FIG. 17a is after placing several elements near the pool and attaching them to each other, for example by gluing them. The elements shown in the present illustration are:

one corner modular floor element 180, two peripheral elongated modular floor elements 120, one T-intersection modular floor element 160 and one inner elongated modular floor element 100.

Figure 17B:
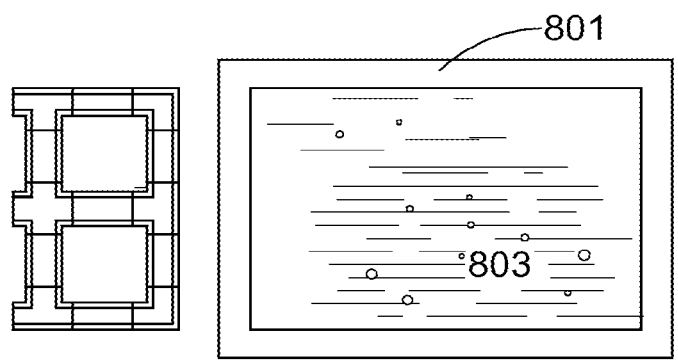

The state shown in FIG. 17b is after assembly of elements into a whole row, which in the present case, corresponds with the width of the pool.

Figure 17C:
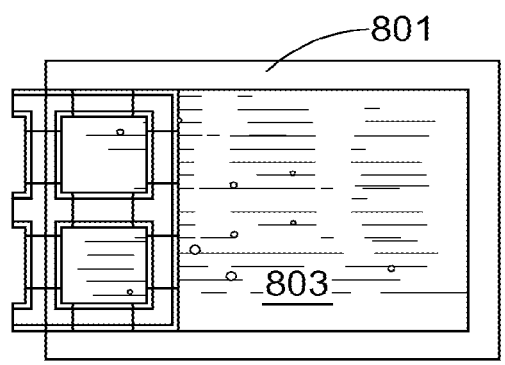

The state shown in FIG. 17c is after pushing some of the elements, which have already been attached to each other, into the pool.

Figure 17D:
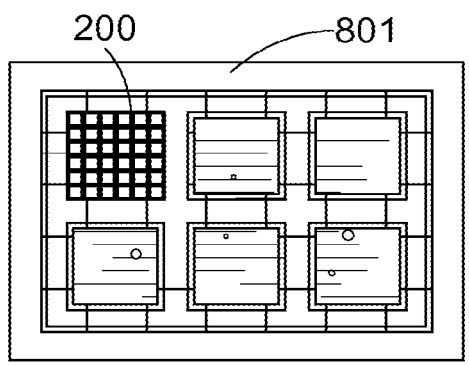

The state shown in FIG. 17d is after pushing all of the elements covering the entire area of the pool, and also after placing one flooring tile 200.

Placement of the elements can also be in a different order of stages, and the order presented above is in no way limiting the present invention.

Figure 18:
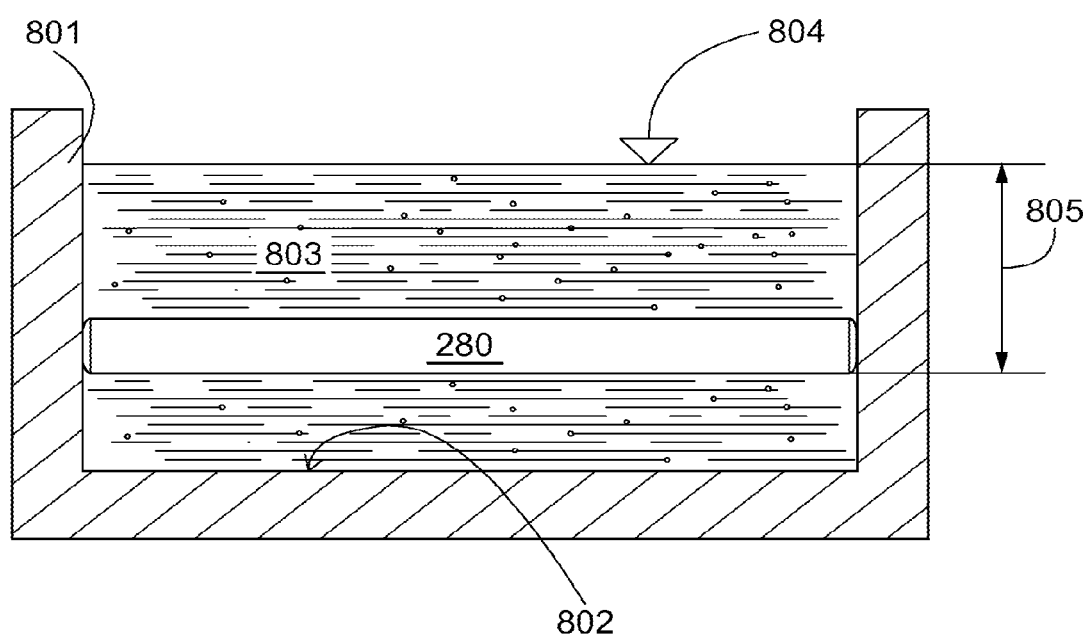
FIG. 18 is a side view schematic illustration of an illustrative, exemplary embodiment of a raisable floor inside water between pool walls, according to the present invention.

FIG. 18 is a side view schematic illustration of an illustrative, exemplary embodiment of a raisable floor 280 inside water 803 between pool walls 801, according to the present invention.

In the state shown in the present illustration, the raisable floor 280 is at a distance from both the pool bottom 802 and the water surface 804. This state also occurs both during sinking of the raisable floor 280 toward the pool bottom 802 and during raising toward the water surface 804.

During raising, the raisable floor 280 is preferably entirely horizontal, and the control of horizontality can be facilitated with data regarding modular floor elements depth 805.

The following is a summary of some of the features of the present invention which may provide one or more advantages over the prior art, and which may enable it to serve for life-saving in swimming pools.

The system may involve a combination of mechanical elements not present in the prior art solutions, including: valves, pipes, ballasting receptacles, partition barriers, air bags, air cushions, manual or computer controlled operation, communication with a drowning detection system for rapid and automatic elevation of the floor in the case of an alarm signal received by the detection system.

The system may have a modular construction.

The system may include partition barriers implemented inside the ballasting receptacles. The cross section of each such partition barrier is smaller that the inner cross section of the ballasting receptacles.

The elevating floor system according to the present invention may enable to automatically rescue a drowning person and lift him above the water level.

The top surface of the "elevation floor system" according to the invention can be adjusted at a variable height from the floor bottom, such that the whole floor system is submerged under the water, or that the top surface of the elevation system is leveled with the water level in the pool, or that the top surface of the elevating system is raised above the water level in order to level it with the ground level.

The elevating floor system according to the invention can elevate faster than prior art solutions. In addition, the flotation mechanism may enable control of the elevation speed and tilts of the whole elevation floor system.

The design of the elevating floor system according to the present invention may be based on flotation fluid pipes built in the top of the ballasting receptacles. The flotation fluid may enter the ballasting receptacles through one way valves which keeps the pool's fluid from entering the ballasting pipes, thereby providing a method for instant distribution of flotation fluid to remote parts of the floor system.

The elevating floor system according to the present invention may be ready for operation at the bottom of the pool with the ballasting receptacles already partially filled with flotation fluid. This provides a capability such that only an additional small volume of flotation fluid is sufficient for lifting the whole floor system.

The flotation fluid may enter the top of the ballasting receptacles. Thus, the surface area between the flotation fluid and pool fluid may be maximized and the work necessary to empty the ballasting receptacles from the pool fluid is minimal This manner of filling may enable fast elevation of the floor system.

Partition barriers may be placed inside the ballasting receptacles for controlling and slowing the air flow in the ballasting receptacles thus providing a capability for raising the elevating floor system of the invention in a restrained fashion.

The flotation mechanism according to the invention may receive input signal from a feedback system, thus providing a capability for a safe and controlled manner of elevating the floor system.

The manner of installation of the elevation floor system of the current invention need not require emptying the pool or interfering with the pool's structure.

While the invention has been described with respect to a limited number of embodiments, it will be appreciated that many variations, modifications and other applications of the invention may be made.

What is claimed is:

1. A method for assembling a rapid elevation floor system in a pool, the method comprising the stages of:
   (a) assembling a raisable floor inside said pool;
   (b) adding sensors to said raisable floor, and connecting said raisable floor platform to auxiliary units;
   (c) laying flooring tiles on said raisable floor; and
   (d) sinking said raisable floor to a bottom of said pool;
   wherein the stage of assembling a raisable floor inside said pool includes the sub-stages of:
   (i) laying a corner modular floor element;
   (ii) laying two peripheral elongated modular floor element and connected them to said corner modular floor element;
   (iii) laying a T-intersection modular floor element and connected it to a peripheral elongated modular floor element;
   (iv) laying an inner elongated modular floor element and connected it to a peripheral elongated modular floor element; and
   (v) laying a cross intersection modular floor element and connected it to an inner elongated modular floor element;
   and wherein the stage of sinking said raisable floor platform to a bottom of said pool includes the sub-stages of:
   (i) operatively connected a human-machine interface, a command and control unit, a flotation fluid source, and a manifold to said raisable floor; and
   (ii) operatively connected a second type sensor and a pressure sensor to the raisable floor.

2. A method for rapid and controlled elevation of a raisable floor in a pool, the method comprising the stage of:
   (a) elevating a raisable floor to a water surface in said pool, wherein said floor system includes:
   (i) at least two modular floor elements, wherein at least some of which include a ballasting receptacle inner volume, said ballasting receptacle inner volume being adapted to receive and discharge a volume of a flotation fluid; and
   (ii) a flotation fluid conducting tubing in fluid connection with said ballasting receptacle inner volume, wherein said flotation fluid conducting tubing of at least one modular floor element is in fluid connection with said flotation fluid conducting tubing of at least three other of said modular floor elements, for forming a continuous flotation fluid conducting tubing.

3. The method for rapid and controlled elevation of a raisable floor in pool of claim 2, wherein the stage of elevating a rais able floor to a water surface in said pool includes the sub-stages of:
   (i) keeping a predetermined amount of flotation fluid inside ballasting receptacle inner volumes of said raisable floor for controlling a raisable floor specific gravity, wherein said raisable floor is laying on a pool bottom;
   (ii) infusing flotation fluid inside said ballasting receptacle inner volumes of said raisable floor for controlled elevation of said raisable floor;
   (iii) measuring modular floor elements depth difference inside said water among certain of said at least two modular floor elements;
   (iv) balancing said raisable floor by infusing controlled amount of flotation fluid into said ballasting receptacle inner volumes; and
   (v) limiting a movement of air within said ballasting receptacle inner volume according to modular floor elements depths, for the purpose of improving a stability of said raisable floor and its controllability.

4. The method for rapid and controlled elevation of a raisable floor in pool of claim 2 further comprising the stage of:
   (b) before elevating said raisable floor, detecting an unusual situation inside said water of said pool.

5. The method for in pool of claim 4, wherein the stage of detecting an un-normal situation inside said water of said pool includes the sub-stages of:
   (i) receiving a signals from at least one sensor; and
   (ii) recognizing said signals as a result from an emergence situation.

* * * * *